(12) United States Patent
Newman, Jr. et al.

(10) Patent No.: US 11,574,754 B2
(45) Date of Patent: Feb. 7, 2023

(54) MAGNETIC SENSING SYSTEM FOR A ROTARY CONTROL DEVICE

(71) Applicant: Lutron Technology Company LLC, Coopersburg, PA (US)

(72) Inventors: Robert C. Newman, Jr., Emmaus, PA (US); Alexander Wade Gage, Villanova, PA (US); Stephen M. Ludwig, Jr., Coopersburg, PA (US); William Taylor Shivell, Breinigsville, PA (US)

(73) Assignee: Lutron Technology Company LLC, Coopersburg, PA (US)

( * ) Notice: Subject to any disclaimer, the term of this patent is extended or adjusted under 35 U.S.C. 154(b) by 0 days.

(21) Appl. No.: 17/691,185

(22) Filed: Mar. 10, 2022

(65) Prior Publication Data
US 2022/0199307 A1 Jun. 23, 2022

Related U.S. Application Data

(63) Continuation of application No. 16/902,891, filed on Jun. 16, 2020, now Pat. No. 11,309,111, which is a
(Continued)

(51) Int. Cl.
*H01F 7/02* (2006.01)
*H02K 11/215* (2016.01)
(Continued)

(52) U.S. Cl.
CPC ........... *H01F 7/0205* (2013.01); *G01R 33/07* (2013.01); *H01F 7/0273* (2013.01);
(Continued)

(58) Field of Classification Search
CPC ... H01F 7/0205; H01F 7/0273; H02K 11/215; G01R 33/07; G01R 33/0005;
(Continued)

(56) References Cited

U.S. PATENT DOCUMENTS 5,264,761 A  11/1993  Johnson et al.
5,905,442 A   5/1999  Mosebrook et al.
(Continued)

FOREIGN PATENT DOCUMENTS

CN  2596671 Y  12/2003

*Primary Examiner* — Mohamad A Musleh
(74) *Attorney, Agent, or Firm* — Flaster Greenberg P.C.

(57) ABSTRACT

A control device includes a moving portion, a magnetic element coupled to the moving portion, at least one magnetic sensing circuit responsive to magnetic fields, and at least one magnetic flux pipe structure. The magnetic element may comprise alternating positive and negative sections configured to generate a magnetic field. The magnetic element may be any shape, such as circular, linear, etc. The magnetic sensing circuit may be radially offset from the magnetic element, and the magnetic flux pipe structure may be configured to conduct the magnetic field generated by the magnetic element towards the magnetic sensing circuit. The magnetic element may generate the magnetic field in a first plane, and the magnetic sensing may be responsive to magnetic fields in a second direction that is angularly offset from the first plane. The magnetic flux pipe structure may redirect the magnetic field towards the magnetic sensing circuit in the second direction.

21 Claims, 15 Drawing Sheets

Related U.S. Application Data continuation of application No. 15/631,459, filed on Jun. 23, 2017, now Pat. No. 10,720,274.

(60) Provisional application No. 62/356,989, filed on Jun. 30, 2016.

(51) Int. Cl.
| | |
|---|---|
| *H03K 17/97* | (2006.01) |
| *G01R 33/07* | (2006.01) |
| *G01D 5/245* | (2006.01) |
| *H03K 17/95* | (2006.01) |
| *G01R 33/00* | (2006.01) |

(52) U.S. Cl.
CPC ........... *H02K 11/215* (2016.01); *H03K 17/97* (2013.01); *G01D 5/2451* (2013.01); *G01R 33/0005* (2013.01); *H03K 2017/9527* (2013.01); *H03K 2017/9713* (2013.01); *H03K 2217/94068* (2013.01)

(58) Field of Classification Search
CPC ........... H03K 17/97; H03K 2017/9527; H03K 2017/9713; H03K 2217/94068; G01D 5/2451
See application file for complete search history.

(56) References Cited

U.S. PATENT DOCUMENTS

| | | |
|---|---|---|
| 7,242,150 B2 | 7/2007 | Dejonge et al. |
| 7,546,473 B2 | 6/2009 | Newman et al. |
| 7,573,208 B2 | 8/2009 | Newman et al. |
| 7,834,856 B2 | 11/2010 | Grinshpoon et al. |
| 7,940,167 B2 | 5/2011 | Steiner et al. |
| 8,009,042 B2 | 8/2011 | Steiner et al. |
| 8,199,010 B2 | 6/2012 | Sloan et al. |
| 8,330,638 B2 | 12/2012 | Altonen et al. |
| 8,410,706 B2 | 4/2013 | Steiner et al. |
| 8,451,116 B2 | 5/2013 | Steiner et al. |
| 8,664,881 B2 | 3/2014 | Salvestrini et al. |
| 9,208,965 B2 | 12/2015 | Busby et al. |
| 9,418,802 B2 | 8/2016 | Romano et al. |
| 9,520,247 B1 | 12/2016 | Finnegan et al. |
| 9,583,288 B2 | 2/2017 | Jones et al. |
| 9,799,469 B2 | 10/2017 | Bailey et al. |
| 9,959,997 B2 | 5/2018 | Bailey et al. |
| 2008/0111491 A1 | 5/2008 | Spira et al. |
| 2008/0250873 A1 | 10/2008 | Prudham et al. |
| 2008/0290862 A1 | 11/2008 | Legrand et al. |
| 2009/0121707 A1 | 5/2009 | Schott |
| 2009/0206983 A1 | 8/2009 | Knode et al. |
| 2012/0292174 A1 | 11/2012 | Mah et al. |
| 2012/0326817 A1 | 12/2012 | Kayama et al. |
| 2013/0106406 A1 | 5/2013 | Sugita et al. |
| 2013/0200965 A1 | 8/2013 | Bondar |
| 2013/0222122 A1 | 8/2013 | Killo et al. |
| 2014/0117871 A1 | 5/2014 | Swatsky et al. |
| 2015/0077021 A1 | 3/2015 | McCarthy et al. |
| 2015/0371534 A1 | 12/2015 | Dimberg et al. |
| 2016/0073479 A1 | 3/2016 | Erchak et al. |
| 2016/0305795 A1 | 10/2016 | Eisenbeis |
| 2017/0105176 A1 | 4/2017 | Finnegan et al. |
| 2017/0108411 A1 | 4/2017 | Komuro et al. |
| 2018/0190451 A1 | 7/2018 | Scruggs |

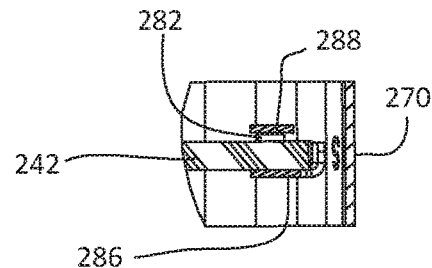
FIG. 8
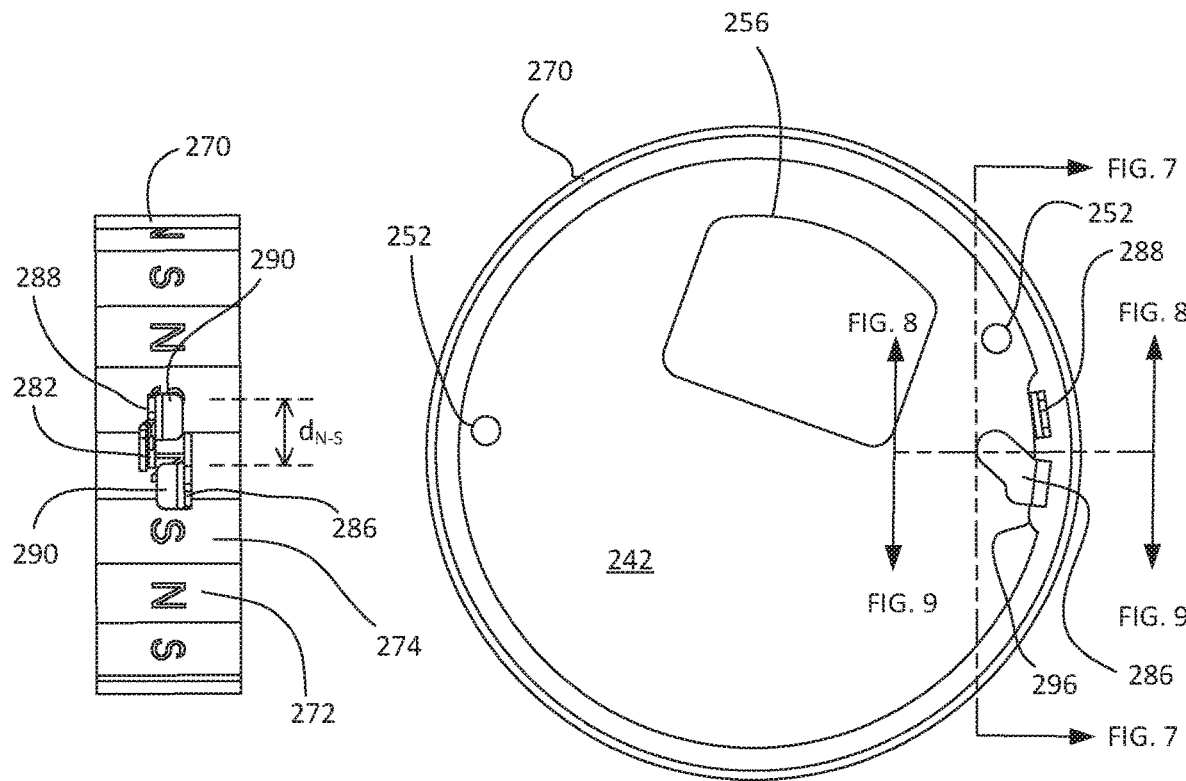
FIG. 7
FIG. 6
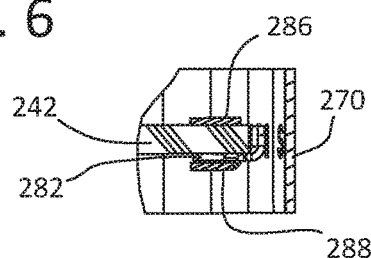
FIG. 9

MAGNETIC SENSING SYSTEM FOR A ROTARY CONTROL DEVICE

CROSS-REFERENCE TO RELATED APPLICATIONS

This application is a continuation of U.S. patent application Ser. No. 16/902,891, filed Jun. 16, 2020, which is a continuation of U.S. patent application Ser. No. 15/631,459, filed Jun. 23, 2017, which issued as U.S. Pat. No. 10,720,274 on Jul. 21, 2020, which claims the benefit of Provisional U.S. Patent Application No. 62/356,989, filed Jun. 30, 2016, the disclosures of which is incorporated herein by reference in its entirety.

BACKGROUND

In accordance with prior art installations of load control systems, one or more standard mechanical toggle switches may be replaced by more advanced load control devices (e.g., dimmer switches). Such a load control device may operate to control an amount of power delivered from an alternative current (AC) power source to an electrical load. The procedure of replacing a standard mechanical toggle switch with a load control device typically requires disconnecting electrical wiring, removing the mechanical toggle switch from an electrical wallbox, installing the load control device into the wallbox, and reconnecting the electrical wiring to the load control device. Often, such a procedure is performed by an electrical contractor or other skilled installer. Average consumers may not feel comfortable undertaking the electrical wiring that is necessary to complete installation of a load control device. Accordingly, there is a need for a load control system that may be installed into an existing electrical system that has a mechanical toggle switch, without requiring any electrical wiring work.

SUMMARY

Provided herein are examples of a control device. The control device may include a moving portion, a magnetic element coupled to the moving portion, at least one magnetic sensing circuit, and at least one magnetic flux pipe structure. The magnetic element may include alternating positive and negative sections. The magnetic element may be configured to generate a magnetic field in a first plane (e.g., a first direction), for example, when the magnetic element is moved (e.g., rotated, slid in a linear direction, etc.). For example, the magnetic element may include a circular magnetic element and the moving portion may include a rotating portion. Alternatively or additionally, the magnetic element may include a linear magnetic element and the moving portion may include a linear slider.

The magnetic sensing circuit may be responsive to magnetic fields in a second direction that is angularly offset from the first direction. In some instances, the angular offset may be a 90 degree offset. The magnetic sensing circuit may include a Hall-effect sensing circuit. In some examples, the control device may include two magnetic sensing circuits that each comprise two magnetic element coupling portions, where the magnetic element coupling portions of the two magnetic sensing circuits are offset from the centers of two adjacent positive and negative sections of the magnetic element. When magnetic element coupling portions of the first magnetic sensing circuit are lined up with the centers of two adjacent positive and negative sections of the magnetic element, magnetic element coupling portions of the second magnetic sensing circuit are each lined up with a transition between a positive section and a negative section of the magnetic element.

The magnetic flux pipe structure configured to conduct the magnetic field generated by the magnetic element and redirect the magnetic field towards the at least one magnetic sensing sensor circuit in the second direction. The magnetic flux pipe structure may include a magnetic element coupling portion, a sensor coupling portion, and a mounting portion, where the magnetic element coupling portion and the sensor coupling portion are located at opposite ends of the magnetic flux pipe structure. The sensor coupling portion may be arranged in a plane that is perpendicular to a plane of the respective magnetic element coupling portion. The mounting portion may be attached to a printed circuit board (PCB) of the load control device. The magnetic element coupling portion may be positioned adjacent to the magnetic element and located in a notch in the PCB when the mounting portion is attached to the PCB.

The control device may be a load control device or a remote control device. For example, the control device may include a base portion and a control unit. The base portion may be configured to be fixedly attached to an actuator of a mechanical switch. The base portion may be configured to maintain the actuator in the on position. The control unit may include the moving portion, the magnetic element, the at least one magnetic sensing circuit, and the at least one magnetic flux pipe structure. The control unit may be configured to be removeably attached to the base portion. The control unit may include a wireless communication circuit configured to transmit one or more wireless communication signals to one or more control devices. Alternatively or additionally, the control device may include a yoke configured to mount the control device to a standard electrical wallbox, such that the control device is configured to be coupled in series electrically connection between an alternating current (AC) power source and a controllable electrical load.

In instances where the control device is implemented as a remote control device, the control device may provide a simple retrofit solution for an existing switched control system. Implementation of the remote control device, for example in an existing switched control system, may enable energy savings and/or advanced control features, for example without requiring any electrical re-wiring and/or without requiring the replacement of any existing mechanical switches. Although it should be appreciated that the techniques described herein may be incorporated into a wall-mounted load control device that is configured to be electrically coupled between an alternating current (AC) power source and an electrical load, and/or into a table top, handheld, or wall-mounted remote control device.

The remote control device may be configured to associate with, and control, a load control device of a load control system, without requiring access to the electrical wiring of the load control system. An electrical load may be electrically connected to the load control device such that the remote control device may control an amount of power delivered to the electrical load via the load control device.

The remote control device may be configured to be mounted over the toggle actuator of a mechanical switch that controls whether power is delivered to the electrical load. The remote control device may be configured to maintain the toggle actuator in an on position when mounted over the toggle actuator, such that a user of the remote control device is not able to mistakenly switch the toggle actuator to the off position, which may cause the electrical load to be unpowered such that the electrical load cannot be controlled by one or more remote control devices.

BRIEF DESCRIPTION OF THE DRAWINGS

FIG. 6 is a partial front view of the control unit illustrating structure of a Hall-effect sensor system of the retrofit remote control device.

FIG. 7 is a partial side cross-sectional view taken through the line shown in FIG. 6 to illustrate the orientation of components of Hall-effect sensor system without a printed circuit board shown.

FIG. 8 is a partial side cross-sectional view to further illustrate the orientation of the components of Hall-effect sensor system.

FIG. 9 is a partial side cross-section view taken opposite the view of FIG. 8.

DETAILED DESCRIPTION

Figure 1:
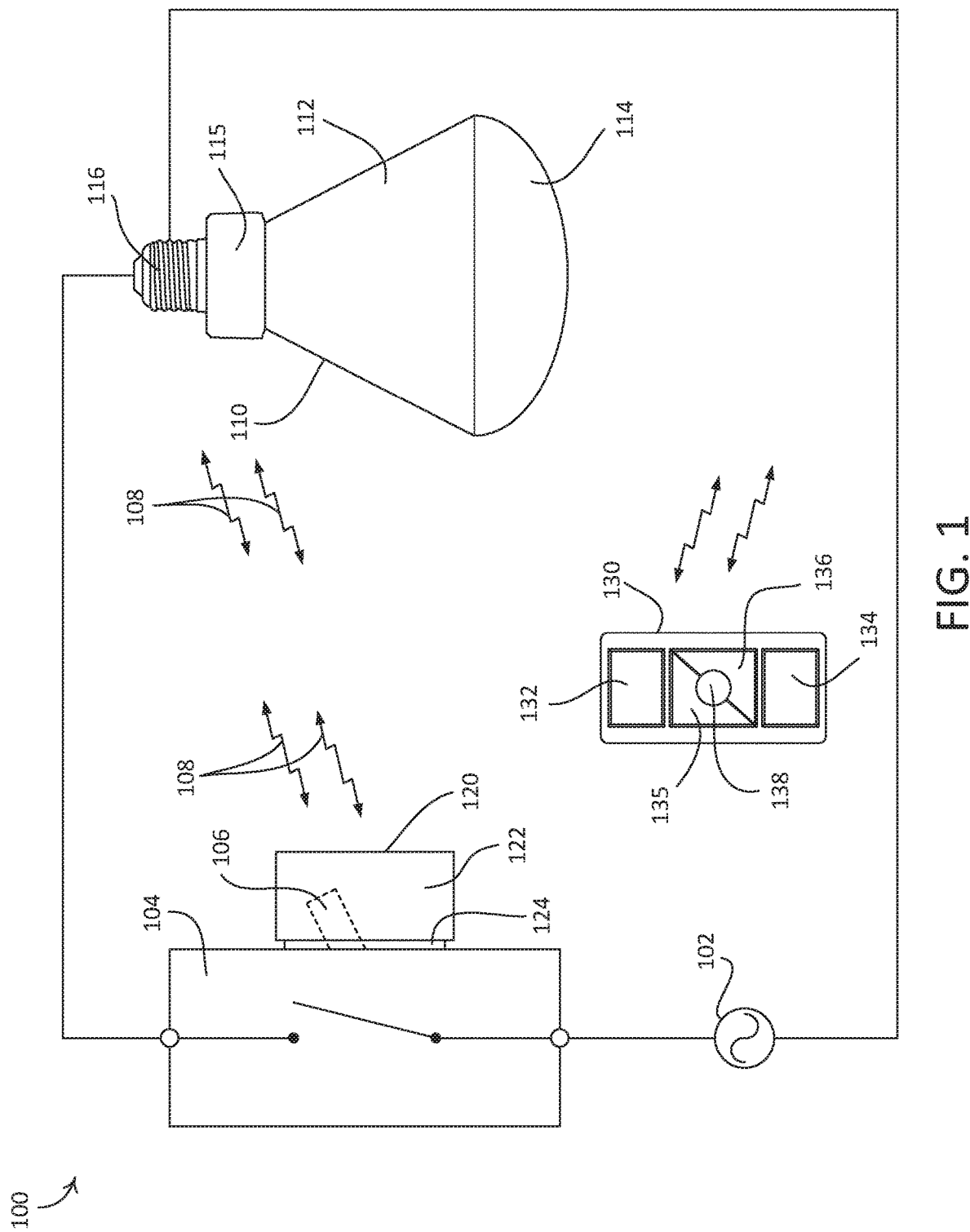
FIG. 1 is a simplified diagram of an example load control system that includes an example retrofit remote control device.

FIG. 1 depicts an example load control system 100. As shown, the load control system 100 is configured as a lighting control system that includes an electrical load, such as a controllable light source 110, and a remote control device 120, such as a battery-powered rotary remote control device. The remote control device 120 may include a wireless transmitter. The load control system 100 may include a standard, single pole single throw (SPST) maintained mechanical switch 104 (e.g., a "toggle switch" or a "light switch") that may be in place prior to installation of the remote control device 120 (e.g., pre-existing in the load control system 100). The switch 104 may be electrically coupled in series between an alternating current (AC) power source 102 and the controllable light source 110. The switch 104 may include a toggle actuator 106 that may be actuated to toggle, for example to turn on and/or turn off, the controllable light source 110. The controllable light source 110 may be electrically coupled to the AC power source 102 when the switch 104 is closed (e.g., conductive), and may be disconnected from the AC power source 102 when the switch 104 is open (e.g., nonconductive).

The remote control device 120 may be operable to transmit wireless signals, for example radio frequency (RF) signals 108, to the controllable light source 110 for controlling the intensity of the controllable light source 110. The controllable light source 110 may be associated with the remote control device 120 during a configuration procedure of the load control system 100, such that the controllable light source 110 is then responsive to the RF signals 108 transmitted by the remote control device 120. An example of a configuration procedure for associating a remote control device with a load control device is described in greater detail in commonly-assigned U.S. Patent Publication No. 2008/0111491, published May 15, 2008, entitled "Radio-Frequency Lighting Control System," the entire disclosure of which is hereby incorporated by reference.

The controllable light source 110 may include an internal lighting load (not shown), such as, for example, a light-emitting diode (LED) light engine, a compact fluorescent lamp, an incandescent lamp, a halogen lamp, or other suitable light source. The controllable light source 110 includes a housing 112 that defines an end portion 114 through which light emitted from the lighting load may shine. The controllable light source 110 may include an enclosure 115 that is configured to house one or more electrical components of the controllable light source 110, such as an integral load control circuit (not shown), for controlling the intensity of the lighting load between a low-end intensity (e.g., approximately 1%) and a high-end intensity (e.g., approximately 100%).

The controllable light source 110 may include a wireless communication circuit (not shown) housed inside the enclosure 115, such that the controllable light source 110 may be operable to receive the RF signals 108 transmitted by the remote control device 120 and control the intensity of the lighting load in response to the received RF signals. As shown, the enclosure 115 is attached to the housing 112. Alternatively, the enclosure 115 may be integral with, for example monolithic with, the housing 112, such that the enclosure 115 defines an enclosure portion of the housing 112. The controllable light source 110 may include a screw-in base 116 that is configured to be screwed into a standard Edison socket, such that the controllable light source may be coupled to the AC power source 102. The controllable light source 110 may be configured as a downlight (e.g., as shown in FIG. 1) that may be installed in a recessed light fixture. The controllable light source 110 is not limited to the illustrated screw-in base 116, and may include any suitable base, for example a bayonet-style base or other suitable base providing electrical connections.

The load control system 100 may also include one or more other devices configured to wirelessly communicate with the controllable light source 110. As shown, the load control system 100 includes a handheld, battery-powered, remote control device 130 for controlling the controllable light source 110. The remote control device 130 may include one or more buttons, for example, an on button 132, an off button 134, a raise button 135, a lower button 136, and a preset button 138, as shown in FIG. 1. The remote control device 130 may include a wireless communication circuit (not shown) for transmitting digital messages (e.g., including commands to control the lighting load) to the controllable light source 110, for example via the RF signals 108, responsive to actuations of one or more of the buttons 132, 134, 135, 136, and 138. Alternatively, the remote control device 130 may be mounted to a wall or supported by a pedestal, for example a pedestal configured to be mounted on a tabletop. Examples of handheld battery-powered remote controls are described in greater detail in commonly assigned U.S. Pat. No. 8,330,638, issued Dec. 11, 2012, entitled "Wireless Battery Powered Remote Control Having Multiple Mounting Means," and U.S. Pat. No. 7,573,208, issued Aug. 22, 1009, entitled "Method Of Programming A Lighting Preset From A Radio-Frequency Remote Control," the entire disclosures of which are hereby incorporated by reference.

The load control system 100 may also include one or more of a remote occupancy sensor or a remote vacancy sensor (not shown) for detecting occupancy and/or vacancy conditions in a space surrounding the sensors. The occupancy or vacancy sensors may be configured to transmit digital messages to the controllable light source 110, for example via RF signals (e.g., the RF signals 108), in response to detecting occupancy or vacancy conditions. Examples of RF load control systems having occupancy and vacancy sensors are described in greater detail in commonly-assigned U.S. Pat. No. 7,940,167, issued May 10, 2011, entitled "Battery Powered Occupancy Sensor," U.S. Pat. No. 8,009,042, issued Aug. 30, 2011, entitled "Radio Frequency Lighting Control System With Occupancy Sensing," and U.S. Pat. No. 8,199,010, issued Jun. 12, 2012, entitled "Method And Apparatus For Configuring A Wireless Sensor," the entire disclosures of which are hereby incorporated by reference.

The load control system 100 may include a remote daylight sensor (not shown) for measuring a total light intensity in the space around the daylight sensor. The daylight sensor may be configured to transmit digital messages, such as a measured light intensity, to the controllable light source 110, for example via RF signal (e.g., the RF signals 108), such that the controllable light source 110 is operable to control the intensity of the lighting load in response to the measured light intensity. Examples of RF load control systems having daylight sensors are described in greater detail in commonly assigned U.S. Pat. No. 8,451,116, issued May 28, 2013, entitled "Wireless Battery-Powered Daylight Sensor," and U.S. Pat. No. 8,410,706, issued Apr. 2, 2013, entitled "Method Of Calibrating A Daylight Sensor," the entire disclosures of which are hereby incorporated by reference.

The load control system 100 may include other types of input devices, for example, radiometers, cloudy-day sensors, temperature sensors, humidity sensors, pressure sensors, smoke detectors, carbon monoxide detectors, air-quality sensors, security sensors, proximity sensors, fixture sensors, partition sensors, keypads, kinetic or solar-powered remote controls, key fobs, cell phones, smart phones, tablets, personal digital assistants, personal computers, laptops, time clocks, audio-visual controls, safety devices, power monitoring devices (e.g., such as power meters, energy meters, utility submeters, utility rate meters), central control transmitters, residential, commercial, or industrial controllers, or any combination of these input devices.

During the configuration procedure of the load control system 100, the controllable light source 110 may be associated with a wireless control device, for example the remote control device 120, by actuating an actuator on the controllable light source 110 and then actuating (e.g., pressing and holding) an actuator on the wireless remote control device (e.g., the rotating portion 122 of the remote control device 120) for a predetermined amount of time (e.g., approximately 10 seconds).

Digital messages transmitted by the remote control device 120, for example directed to the controllable light source 110, may include a command and identifying information, such as a unique identifier (e.g., a serial number) associated with the remote control device 120. After being associated with the remote control device 120, the controllable light source 110 may be responsive to messages containing the unique identifier of the remote control device 120. The controllable light source 110 may be associated with one or more other wireless control devices of the load control system 100, such as one or more of the remote control device 130, the occupancy sensor, the vacancy sensor, and/or the daylight sensor, for example using a similar association process.

After a remote control device, for example the remote control device 120 or the remote control device 130, is associated with the controllable light source 110, the remote control device may be used to associate the controllable light source 110 with the occupancy sensor, the vacancy sensor, and/or the daylight sensor, without actuating the actuator 118 of the controllable light source 110, for example as described in greater detail in commonly-assigned U.S. patent application Ser. No. 13/598,529, filed Aug. 29, 2012, entitled "Two Part Load Control System Mountable To A Single Electrical Wallbox," the entire disclosure of which is hereby incorporated by reference.

The remote control device 120 may be configured to be attached to the toggle actuator 106 of the switch 104 when the toggle actuator 106 is in the on position (e.g., typically pointing upwards) and the switch 104 is closed and conductive. As shown, the remote control device 120 may include a rotating portion 122 and a base portion 124. The base portion 124 may be configured to be mounted over the toggle actuator 106 of the switch 104. The rotating portion 122 may be supported by the base portion 124 and may be rotatable about the base portion 124.

When the remote control device 120 is mounted over the toggle actuator of a switch (e.g., the toggle actuator 106), the base portion 124 may function to secure the toggle actuator 106 from being toggled. For example, the base portion 124 may be configured to maintain the toggle actuator 106 in an on position, such that a user of the remote control device 120 is not able to mistakenly switch the toggle actuator 106 to the off position, which may disconnect the controllable light source 110 from the AC power source 102, such that controllable light source 110 may not be controlled by one or more remote control devices of the load control system 100 (e.g., the remote control devices 120 and/or 130), which may in turn cause user confusion.

As shown, the remote control device 120 is battery-powered, and not wired in series electrical connection between the AC power source 102 and the controllable light source 110 (e.g., does not replace the mechanical switch 104), such that the controllable light source 110 receives a full AC voltage waveform from the AC power source 102, and such that the controllable light source 110 does not receive a phase-control voltage that may be created by a standard dimmer switch. Because the controllable light source 110 receives the full AC voltage waveform, multiple controllable light sources (e.g., controllable light sources 110) may be coupled in parallel on a single electrical circuit (e.g., coupled to the mechanical switch 104). The multiple controllable light sources may include light sources of different types (e.g., incandescent lamps, fluorescent lamps, and/or LED light sources). The remote control device 120 may be configured to control one or more of the multiple controllable light sources, for example substantially in unison. In addition, if there are multiple controllable light sources coupled in parallel on a single circuit, each controllable light source may be zoned, for example to provide individual control of each controllable light source. For example, a first controllable light 110 source may be controlled by the remote control device 120, while a second controllable light source 110 may be controlled by the remote control device 130). In prior art systems, a mechanical switch (such as the switch 104, for example) typically controls such multiple light sources in unison (e.g., turns them on and/or off together).

The remote control device 120 may be part of a larger RF load control system than that depicted in FIG. 1. Examples of RF load control systems are described in commonly-assigned U.S. Pat. No. 5,905,442, issued on May 18, 1999, entitled "Method And Apparatus For Controlling And Determining The Status Of Electrical Devices From Remote Locations," and commonly-assigned U.S. Patent Application Publication No. 2009/0206983, published Aug. 20, 2009, entitled "Communication Protocol For A Radio Frequency Load Control System," the entire disclosures of which are incorporated herein by reference.

While the load control system 100 is described herein with reference to the single-pole system shown in FIG. 1, one or both of the controllable light source 110 and the remote control device 120 may be implemented in a "three-way" lighting system having two single-pole double-throw (SPDT) mechanical switches, which may be referred to as "three-way" switches, for controlling a single electrical load. To illustrate, an example system may comprise two remote control devices 120, with one remote control device 120 connected to the toggle actuator of each SPDT switch. In such a system, the toggle actuators of each SPDT switch may be positioned such that the SPDT switches form a complete circuit between the AC power source 102 and the electrical load 110 before the remote control devices 120 are installed on the toggle actuators.

The load control system 100 shown in FIG. 1 may provide a simple retrofit solution for an existing switched control system. The load control system 100 may provide energy savings and/or advanced control features, for example without requiring any electrical re-wiring and/or without requiring the replacement of any existing mechanical switches. To install and use the load control system 100 of FIG. 1, a consumer may replace an existing lamp with the controllable light source 110, switch the toggle actuator 106 of the mechanical switch 104 to the on position, install (e.g., mount) the remote control device 120 onto the toggle actuator 106, and associate the remote control device 120 and the controllable light source 110 with each other, for example as described above.

It should be appreciated that the load control system 100 need not include the controllable light source 110. For example, in lieu of the controllable light source 110, the load control system 100 may alternatively include a plug-in load control device for controlling an external lighting load. For example, the plug-in load control device may be configured to be plugged into a receptacle of a standard electrical outlet that is electrically connected to an AC power source. The plug-in load control device may have one or more receptacles to which one or more plug-in electrical loads, such a table lamp or a floor lamp, may be plugged. The plug-in load control device may be configured to control the intensity of the lighting loads plugged into the receptacles of the plug-in load control device. It should further be appreciated that the remote control device 120 is not limited to being associated with, and controlling, a single load control device. For example, the remote control device 120 may be configured to control multiple controllable load control devices, for example substantially in unison.

Examples of remote control devices configured to be mounted over existing light switches are described in greater detail in commonly-assigned U.S. Pat. No. 9,565,742, issued Feb. 7, 2017, and U.S. Pat. No. 9,633,557, issued Apr. 25, 2017, both entitled "Battery-Powered Retrofit Remote Control Device," the entire disclosures of which are hereby incorporated by reference.

Although described with reference to a remote control device 120 that is configured to mount over an existing mechanical switch, it should be appreciated that the remote control device 120 and/or the rotating portion 122 may be implemented as a dimmer switch, a wall-mounted control device, a tabletop remote control device, and/or a handheld remote control device (e.g., remote control device 130 as shown in FIG. 1). For example, if implemented as a dimmer switch, the dimmer switch may be configured to be mounted to a standard electrical wallbox (e.g., via a yoke) and be coupled in series electrically connection between the AC power source 102 and the controllable light source 110. The dimmer switch may receive an AC mains line voltage $V_{AC}$ from the AC power source 102, and may generate a control signal for controlling the controllable light source 110. The control signal may be generated via various phase-control techniques (e.g., a forward phase-control dimming technique or a reverse phase-control dimming technique). The dimmer switch may be configured to receive wireless signals (e.g., from a remote control device) representative of commands to control the light source 110, and generate respective control signals for executing the commands. An example of a wall-mounted dimmer switch is described in greater detail with reference to FIG. 17, and in commonly-assigned U.S. Pat. No. 7,242,150, issued July 10, 2007, entitled Dimmer Having A Power Supply Monitoring Circuit; U.S. Pat. No. 7,546,473, issued Jun. 9, 2009, entitled Dimmer Having A Microprocessor-Controlled Power Supply; and U.S. Pat. No. 8,664,881, issued Mar. 4, 2014, entitled Two-Wire Dimmer Switch for Low-Power Loads, the entire disclosures of which are hereby incorporated by reference.

Further, it should be appreciated that, although a lighting control system is provided as an example above, a load control system 100 as described herein may include more or fewer lighting loads, other types of lighting loads, and/or other types of electrical loads that may be configured to be controlled by the one or more control devices. For example, the load control system may include one or more of: a dimming ballast for driving a gas-discharge lamp; an LED driver for driving an LED light source; a dimming circuit for controlling the intensity of a lighting load; a screw-in luminaire including a dimmer circuit and an incandescent or halogen lamp; a screw-in luminaire including a ballast and a compact fluorescent lamp; a screw-in luminaire including an LED driver and an LED light source; an electronic switch, controllable circuit breaker, or other switching device for turning an appliance on and off; a plug-in control device, controllable electrical receptacle, or controllable power strip for controlling one or more plug-in loads; a motor control unit for controlling a motor load, such as a ceiling fan or an exhaust fan; a drive unit for controlling a motorized window treatment or a projection screen; one or more motorized interior and/or exterior shutters; a thermostat for a heating and/or cooling system; a temperature control device for controlling a setpoint temperature of a heating, ventilation, and air-conditioning (HVAC) system; an air conditioner; a compressor; an electric baseboard heater controller; a controllable damper; a variable air volume controller; a fresh air intake controller; a ventilation controller; one or more hydraulic valves for use in radiators and radiant heating system; a humidity control unit; a humidifier; a dehumidifier; a water heater; a boiler controller; a pool pump; a refrigerator; a freezer; a television and/or computer monitor; a video camera; an audio system or amplifier; an elevator; a power supply; a generator; an electric charger, such as an electric vehicle charger; an alternative energy controller; and/or the like.

Figure 2:
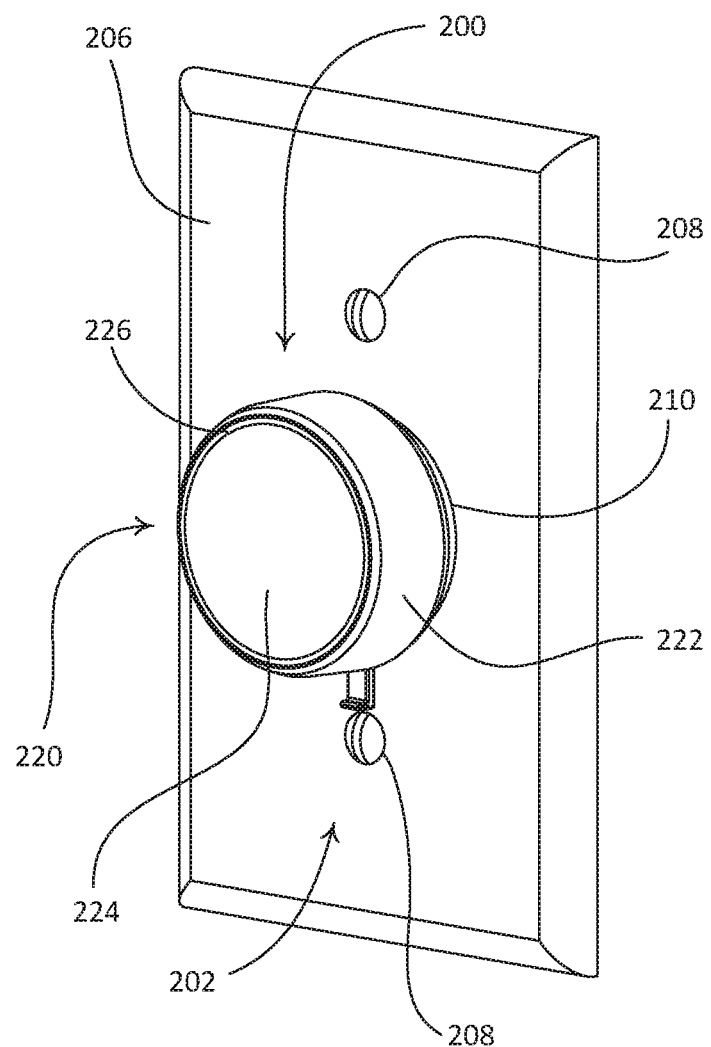
FIG. 2 is a front perspective view of an example retrofit remote control device (e.g., a rotary remote control device)
Figure 3:
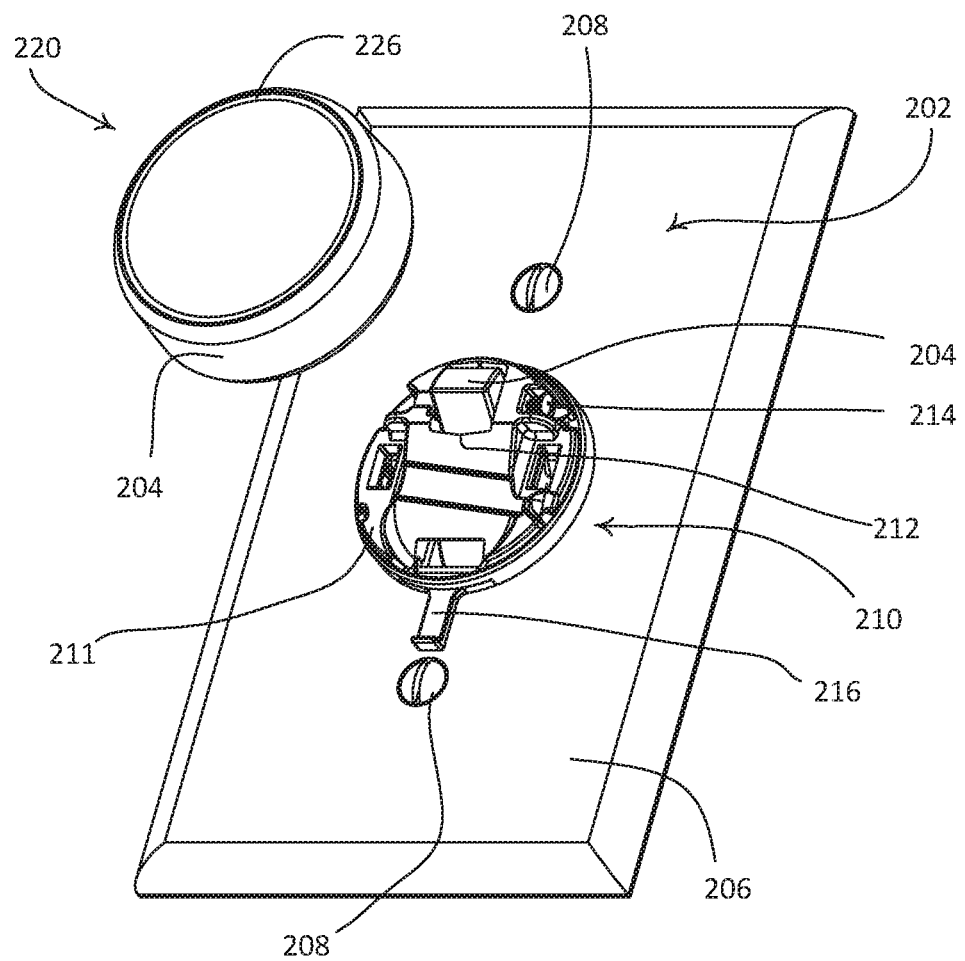
FIG. 3 is a front perspective view of the example retrofit remote control device illustrated in FIG. 2, with a control unit of the remote control device removed from a mounting assembly thereof.

FIGS. 2 and 3 depict an example remote control device 200 (e.g., a battery-powered rotary remote control device) that may be deployed, for example, as the remote control device 120 of the load control system 100 shown in FIG. 1. The remote control device 200 may be configured to be mounted over a toggle actuator 204 of a standard light switch 202 (e.g., the toggle actuator 106 of the SPST maintained mechanical switch 104 shown in FIG. 1). The remote control device 200 may be installed over the toggle actuator 204 of an installed light switch 202 without removing a faceplate 206 that is mounted to the light switch 202 (e.g., via faceplate screws 208).

The remote control device 200 may include a mounting assembly 210 and a control unit 220 (e.g., control module) that may be attached to the mounting assembly 210. The mounting assembly 210 may be more generally referred to as a base portion of the remote control device 200. The control unit 220 may include a rotating portion that is rotatable with respect to the mounting assembly 210. For example, as shown, the control unit 220 includes an annular rotating portion 222 that is configured to rotate about the mounting assembly 210. The remote control device 200 may be configured such that the control unit 220 and the mounting assembly 210 are removeably attachable to one another. FIG. 3 depicts the remote control device 200 with the control unit 220 detached from the mounting assembly 210.

The mounting assembly 210 may be configured to be fixedly attached to the actuator of a mechanical switch, such as the toggle actuator 204 of the light switch 202, and may be configured to maintain the actuator in the on position. For example, as shown the mounting assembly 210 may include a base 211 that defines a toggle actuator opening 212 that extends there through and that is configured to receive at least a portion of the toggle actuator 204. The base 211 may be configured to carry a screw 214 that, when driven inward, may advance into the toggle actuator opening 212 and abut the toggle actuator 204, thereby securing the base 211, and thus the mounting assembly 210, in a fixed position relative to the toggle actuator 204. With the mounting assembly 210 so fixed in position, the toggle actuator 204 may be prevented from being switched to the off position. In this regard, a user of the remote control device 200 may be unable to inadvertently switch the light switch 202 off when the remote control device 200 is mounted to the light switch 202.

The remote control device 200 may be configured to enable releasable attachment of the control unit 220 to the mounting assembly 210. For example, the mounting assembly may include a release mechanism that is operatively coupled to the base 211 and that may be actuated to release the control unit from the mounting assembly 210. As shown, the mounting assembly 210 may include a sliding release tab 216 that may be actuated to release the control unit 220 from the mounting assembly 210. The control unit 220 may include clips (not shown) that may be configured to engage with the mounting assembly 210 when the control unit 220 is attached to the mounting assembly 210. The illustrated release tab 216 may include locking members (not shown) that may be configured to prevent the clips from being released from the mounting assembly 210. The clips may be released by the locking members of the mounting assembly 210 when the release tab 216 is actuated from the locking position to a release position and the control unit 220 is pulled away from the mounting assembly 210. The locking members may be spring biased, and may resiliently return to the locking position after the release tab 216 is actuated to the release position and subsequently released. In this regard, the locking position of the release tab 216 may be referred to as a rest position of the release tab 216. Alternatively, the locking members may not be spring biased, such that the release tab 216 may be manually actuated to return the release tab to the locking position.

The control unit 220 may be attached the mounting assembly 210 without requiring the release tab 216 to be operated to the release position. Stated differently, the control unit 220 may be attached to the mounting assembly when the release tab 216 is in the locking position. For example, the clips of the control unit 220 may be configured to resiliently deflect around the locking members of the release tab 216 and to snap into place behind rear edges of the locking members, thereby securing the control unit 220 to the mounting assembly 210 in an attached position. The control unit 220 may be detached from the mounting assembly 210 (e.g., as shown in FIG. 3), for instance to access one or more batteries 230 (FIG. 4) that may be used to power the control unit 220.

When the control unit 220 is attached to the mounting assembly 210 (e.g., as shown in FIG. 2), the rotating portion 222 may be rotatable in opposed directions about the mounting assembly 210, for example in the clockwise or counter-clockwise directions. The mounting assembly 210 may be configured to be mounted over the toggle actuator 204 of the light switch 202 such that the application of rotational movement to the rotating portion 222 does not actuate the toggle actuator 204. The remote control device 200 may be configured to be mounted to the toggle actuator 204 both when a "switched up" position of the toggle actuator 204 corresponds to an on position of the light switch 202, and when a "switched down" position of the toggle actuator 204 corresponds to the on position of the light switch 202, while maintaining functionality of the remote control device 200.

The control unit 220 may include an actuation portion 224, which may be operated separately from or in concert with the rotating portion 222. As shown, the actuation portion 224 may include a circular surface within an opening defined by the rotating portion 222. In an example implementation, the actuation portion 224 may be configured to move inward towards the light switch 202 to actuate a mechanical switch (not shown) inside the control unit 220, for instance as described herein. The actuation portion 224 may be configured to return to an idle or rest position (e.g., as shown in FIG. 2) after being actuated. In this regard, the actuation portion 224 may be configured to operate as a toggle control of the control unit 220.

The remote control device 200 may be configured to transmit one or more wireless communication signals (e.g., RF signals 108) to one or more control devices (e.g., the control devices of the load control system 100, such as the controllable light source 110). The remote control device 200 may include a wireless communication circuit, e.g., an RF transceiver or transmitter (not shown), via which one or more wireless communication signals may be sent and/or received. The control unit 220 may be configured to transmit digital messages (e.g., including commands) in response to operation of the rotating portion 222 and/or the actuation portion 224. The digital messages may be transmitted to one or more devices associated with the remote control device 200, such as the controllable light source 110. For example, the control unit 220 may be configured to transmit a command via one or more RF signals 108 to raise the intensity of the controllable light source 110 in response to a clockwise rotation of the rotating portion 222 and a command to lower the intensity of the controllable light source in response to a counterclockwise rotation of the rotating portion 222. The control unit 220 may be configured to transmit a command to toggle the controllable light source 110 (e.g., from off to on or vice versa) in response to an actuation of the actuation portion 224. In addition, the control unit 220 may be configured to transmit a command to turn the controllable light source 110 on in response to an actuation of the actuation portion 224 (e.g., if the control unit 220 knows that the controllable light source 110 is presently off). The control unit 220 may be configured to transmit a command to turn the controllable light source 110 off in response to an actuation of the actuation portion 224 (e.g., if the control unit 220 knows that the controllable light source 110 is presently on).

The control unit 220 may include a light bar 226, for example, located between the rotating portion 222 and the actuation portion 224. For example, the light bar 226 may be define a full circle as shown in FIG. 2. The light bar 226 may be attached to a periphery of the actuation portion 224, and may move with the actuation portion 224 when the actuation portion 224 is actuated. The remote control device 200 may provide feedback via the light bar 226, for instance while the rotating portion 222 is being rotated and/or after the remote control device 200 is actuated (e.g., the rotating portion 222 is rotated and/or the actuation portion 224 is actuated). The feedback may indicate, for example, that the remote control device 200 is transmitting one or more RF signals 108. To illustrate, the light bar 226 may be illuminated for a few seconds (e.g., 1-2 seconds) after the remote control device 200 is actuated, and then may be turned off (e.g., to conserve battery life). The light bar 226 may be illuminated to different intensities, for example depending on whether the rotating portion 222 is being rotated to raise or lower the intensity of the lighting load. The light bar 226 may be illuminated to provide feedback of the actual intensity of a lighting load being controlled by the remote control device 200 (e.g., the controllable light source 110).

As described herein, the remote control device 200 may comprise a battery (e.g., such as the battery 230) for powering at least the remote control device 200. The remote control device 200 may be configured to detect a low battery condition and provide an indication of the condition such that a user may be alerted to replace the battery.

Multiple levels of low battery indications may be provided, for example, depending on the amount of power remaining in the battery. For instance, the remote control device 200 may be configured to provide two levels of low battery indications. A first level of indication may be provided when remaining battery power falls below a first threshold (e.g., reaching 20% of full capacity or 80% of battery life). The first level of indication may be provided, for example, by illuminating and/or flashing a portion of the light bar 226 (e.g., a bottom portion of the light bar 226). To distinguish from the illumination used as user feedback and/or to attract a user's attention, the portion of the light bar 226 used to provide the first level of low battery indication may be illuminated in a different color (e.g., red) and/or in a specific pattern (e.g., flashing). The low battery indication may be provided via the light bar 226 regardless of whether the light bar 226 is being used to provide user feedback as described herein. For example, the low battery indication may be provided via the light bar 226 when the light bar 226 is not being used to provide user feedback (e.g., when the actuation portion 224 is not actuated and/or when the rotating portion 222 is not being rotated). The low battery indication may be provided when the light bar 226 is being used to provide user feedback. In such a case, the low battery indication may be distinguished from the user feedback because, for example, the low battery indication is illuminated in a different color (e.g., red) and/or in a specific pattern (e.g., flashing).

Additionally or alternatively, the first level of indication may be provided, for example, by illuminating and/or flashing the bottom portion of the light bar 226, as well as the control unit release tab 216. The control unit release tab 216, which may be used to remove the control unit 220 and obtain access to the battery, may be illuminated. The illumination may be generated by backlighting the control unit release tab 216. For example, the control unit release tab 216 may comprise a translucent (e.g., transparent, clear, and/or diffusive) material and may be illuminated by one or more light sources (e.g., LEDs) located above and/or to the side of the control unit release tab 216 (e.g., inside the control unit 220). The illumination may be steady or flashed (e.g., in a blinking manner) such that the low battery condition may be called to a user's attention. Further, by illuminating the control unit release tab 216, the mechanism for replacing the battery may be highlighted for the user. The user may actuate the control unit release tab 216 (e.g., by pushing up towards the base portion 210 or pulling down away from the base portion 210) to remove the control unit 220 from the base portion 210. The user may then remove and replace the battery.

A second level of low battery indication may be provided when the remaining battery power falls below a second threshold. The second threshold may be set to represent a more urgent situation. For example, the threshold may be set at 5% of full capacity or 95% of the battery life. The second level of indication may be provided, for example, by illuminating and/or flashing one or both of the bottom portion of the light bar 226 and the control unit release tab 216. Since the battery may be critically low when the second level of low battery indication is generated, the remote control device 200 may be configured to not only provide the low battery indication but also take other measures to conserve battery power. For instance, the remote control device 200 may be configured to stop providing user feedback via the light bar 226 (e.g., to not illuminate the light bar).

Figure 4:
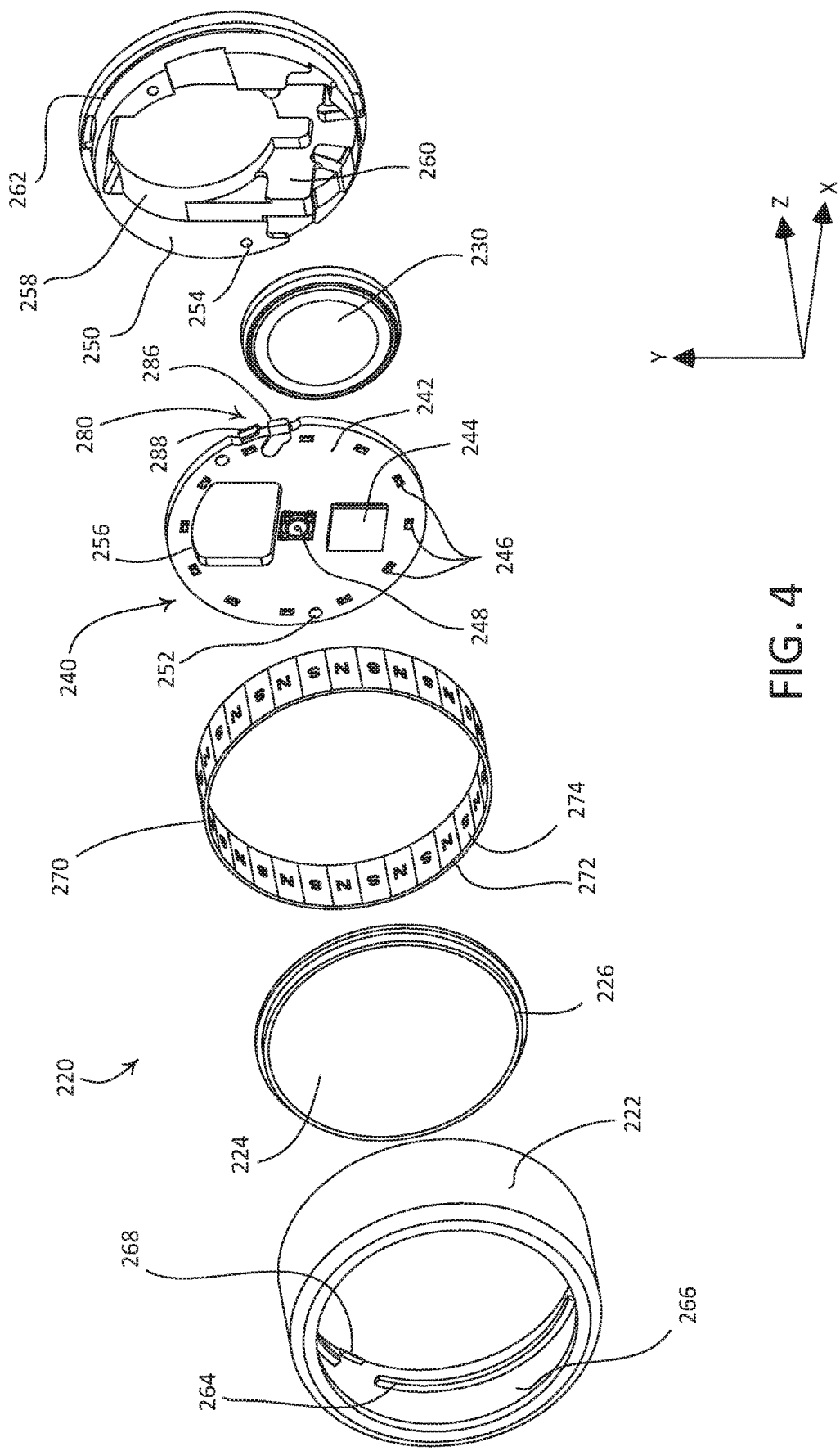
FIG. 4 is a front exploded view of the control unit illustrated in FIG. 3.

FIG. 4 is a front exploded view of the control unit 220 of the remote control device 200 shown in FIG. 2. The light bar 226 may be attached to the actuation portion 224 around a periphery of the actuation portion 224. When the actuation portion 224 is received within the opening of the rotating portion 222, the light bar 226 may be located between the actuation portion 224 and the rotating portion 222.

The control unit 220 may comprise a printed circuit board (PCB) assembly 240 having a PCB 242. The PCB assembly 240 may comprise a control circuit (e.g., including a microprocessor 244) mounted to the PCB 242. The PCB assembly 240 may comprise a plurality of light-emitting diodes (LEDs) 246 arranged around the perimeter of the PCB 242 to illuminate the light bar 226. The PCB assembly 240 may include a mechanical tactile switch 248 mounted to a center of the PCB 242. The control unit 220 may further comprise a carrier 250 to which the PCB 242 is connected. The PCB 242 and the carrier 250 may comprise respective apertures 252, 254 to allow for mechanical connection of the PCB 242 to the carrier 250. The PCB 242 and the carrier 250 may further comprise respective openings 256, 258 that may be configured to receive at least a portion of the toggle actuator 204 of the light switch 202 when the control unit 220 is mounted to the mounting assembly 210. The carrier 250 may define a battery recess 260 that is configured to house the battery 230. When the PCB 242 is connected to the carrier 250, the battery 230 may be located between the PCB 242 and the carrier (e.g., in the battery recess 260) and may be electrically connected to the control circuit on the PCB 242. When the control unit 220 is removed from the mounting assembly 210, the battery 230 may be removed from the control unit through the opening 258 in the carrier 250.

The carrier 250 may comprise a peripheral flange 262, which may abut against a rail 264 on an inner surface 266 of the rotating portion 222 when the control unit 220 is fully assembled. The carrier 250 may be held in place by snaps 268 on the inner surface 266 of the rotating portion 222. When the actuation portion 224 is pressed, the actuation portion 224 may move along the z-direction (e.g., towards the mounting assembly 210) until an inner surface of the actuation portion 224 actuates the mechanical tactile switch 248. The actuation portion 224 may be returned to an idle or rest position by the mechanical tactile switch 248 or a return spring.

The control unit 220 may further comprise a rotational sensing system, e.g., a magnetic sensing system, such as a Hall-effect sensor system, for determining the rotational speed and direction of rotation of the rotating portion 222. The Hall-effect sensor system may comprise circular magnetic element, e.g., a magnetic ring 270 as shown in FIG. 4. The magnetic ring 270 may be located along (e.g., connected to) the inner surface 266 of the rotating portion 222. The magnetic ring 270 may extend around the circumference of the rotating portion 222. The magnetic ring 270 may include a plurality of alternating positive north-pole sections 272 (e.g., labeled with "N" in FIG. 4) and negative south-pole sections 274 (e.g., labeled with "S" in FIG. 4).

Figure 5:
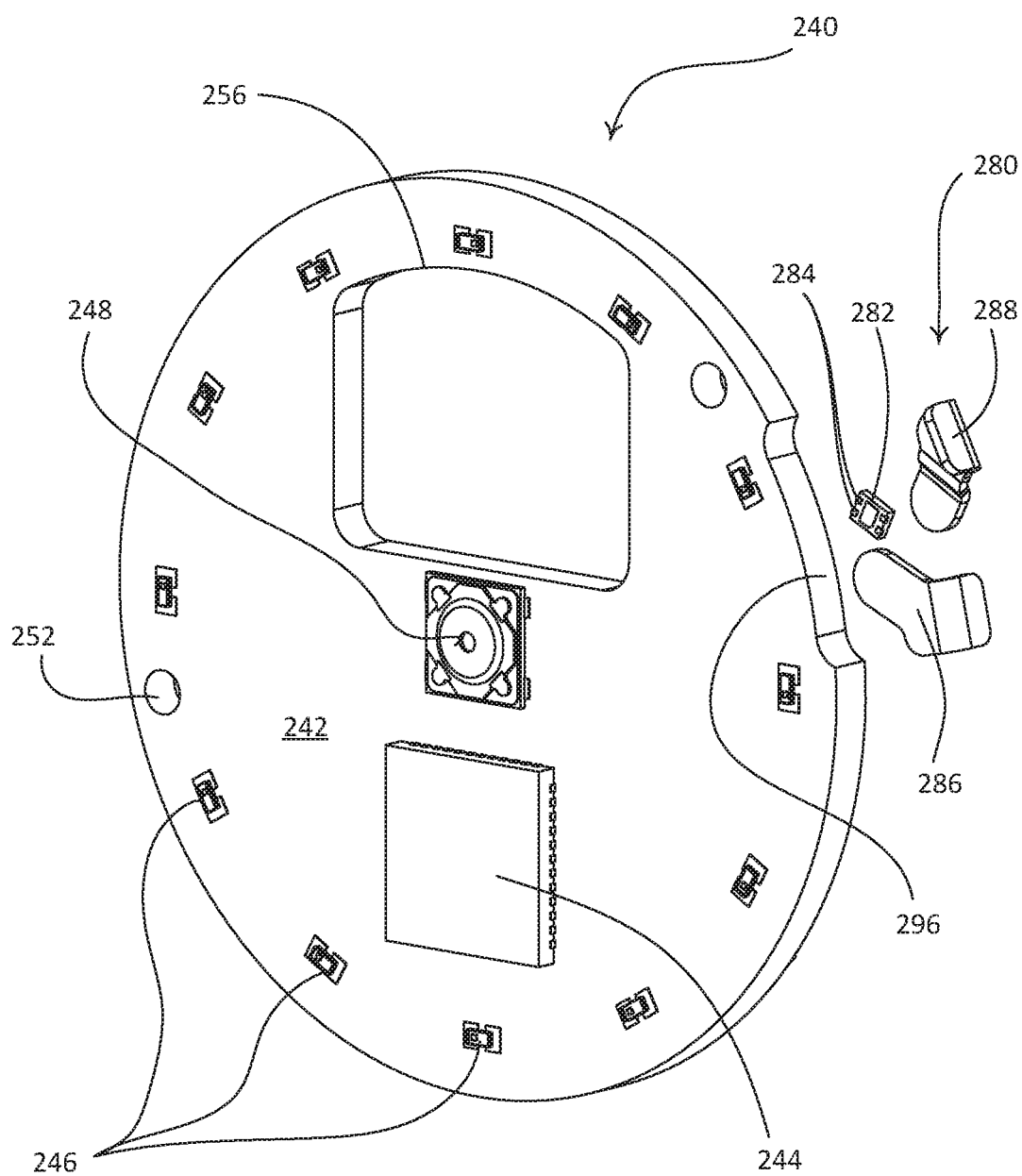
FIG. 5 is an enlarged exploded view of a printed circuit board assembly of the control unit illustrated in FIG. 3.

FIG. 5 is an enlarged exploded view of the PCB assembly 240. The Hall-effect sensor system may further comprise one or more Hall-effect sensing circuits 280. Each Hall-effect sensing circuit 280 may comprise a Hall-effect sensor integrated circuit 282 that may be mounted to the PCB 242 (e.g., to a rear side of the PCB as shown in FIG. 5). The Hall-effect sensor integrated circuit 282 may comprise a plurality of mounting pads 284. While one Hall-effect sensing circuit 280 is shown in FIG. 5, the control unit 220 may comprise two Hall-effect sensing circuits 280 that are configured to detect the passing of the positive and negative sections 272, 274 of the magnetic strip 270 as the rotating portion 222 is rotated (e.g., as will be described in greater detail below). Accordingly, the microprocessor 244 of the control circuit may be configured to determine the rotational speed and direction of rotation of the rotating portion 222 in response to the Hall-effect sensing circuits 280.

The magnetic ring 270 may be configured to generate a magnetic field in a first direction (e.g., perpendicular to the z-direction, along the x-y plane), while the Hall-effect sensor integrated circuit 282 may be responsive to magnetic fields in a second direction (e.g., the z-direction) that is angularly offset from the first direction (e.g., offset by 90 degrees). For example, the Hall-effect sensor integrated circuit 282 of each Hall-effect sensing circuit 280 may be responsive to magnetic fields directed in the z-direction (e.g., perpendicular to the plane of the PCB 242). However, the magnetic ring 270 may generate magnetic fields in directions perpendicular to the z-direction, e.g., in the x-y plane. Accordingly, each Hall-effect sensing circuit 280 may further comprise one or more magnetic flux pipe structures 286, 288 for conducting and directing the magnetic fields generated by the magnetic ring 270 to direct the magnetic fields in the z-direction at the Hall-effect sensor integrated circuit 282.

Figure 10:
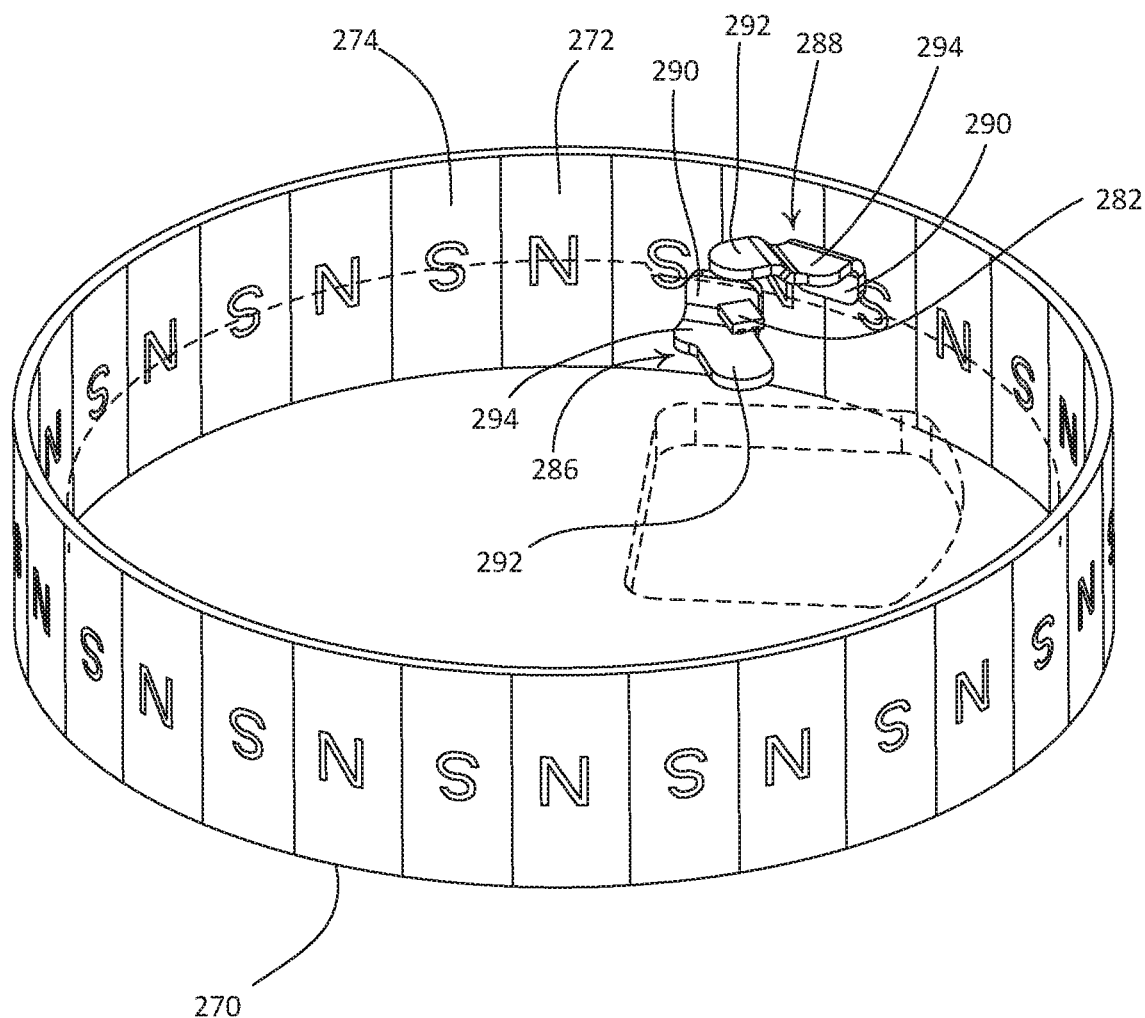
FIG. 10 is a partial rear perspective view of the control unit without the printed circuit board shown, but with the location of the printed circuit board shown in dashed lines.
Figure 11:
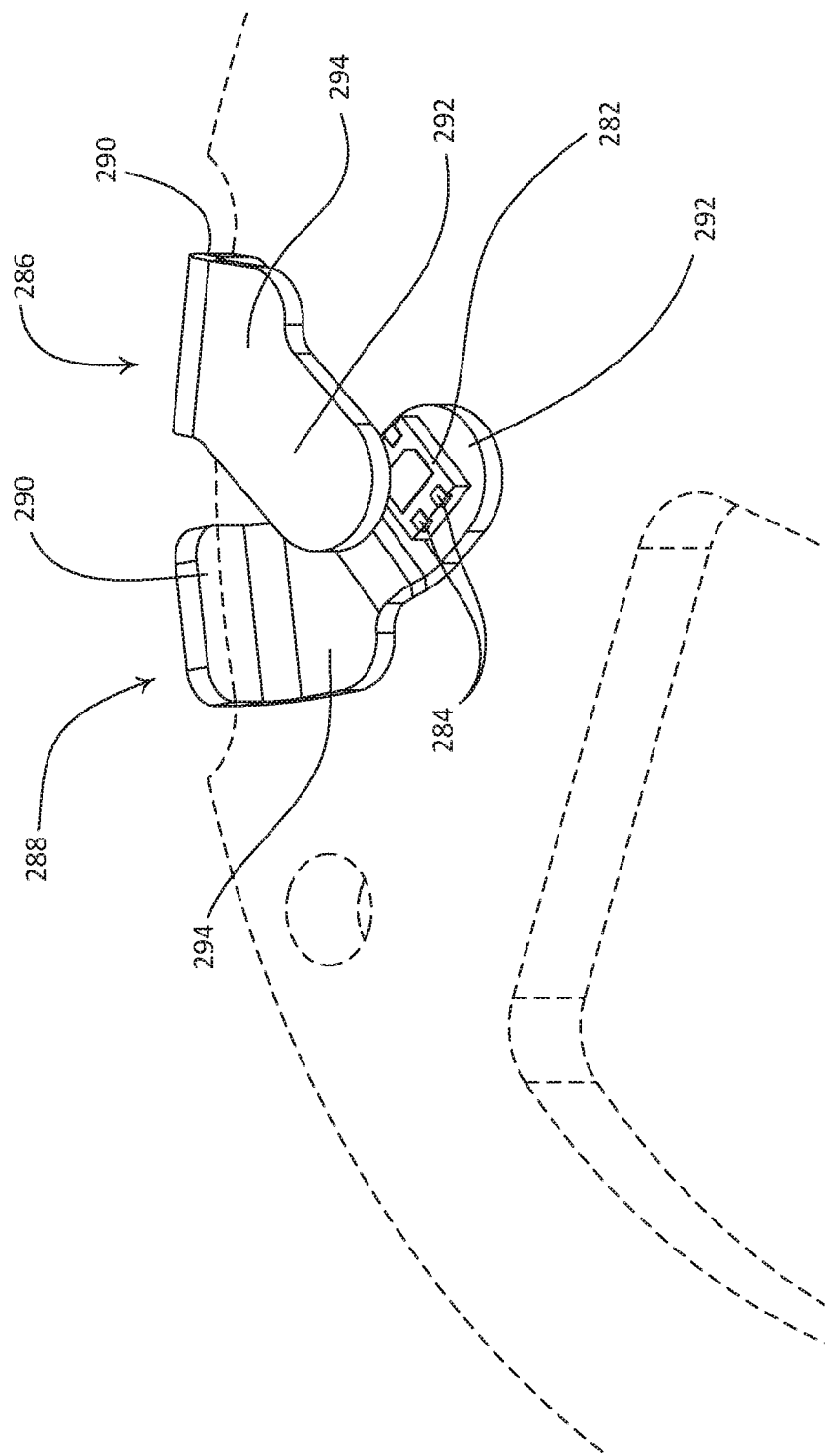
FIG. 11 is an enlarged front perspective view of the components of Hall-effect sensor system without the printed circuit board shown, but with the location of the printed circuit board shown in dashed lines.

FIG. 6 is a partial front view of the control unit 220 illustrating the structure of one Hall-effect sensing circuit 280. FIG. 7 is a side cross-sectional view taken through the line shown in FIG. 6 to illustrate the orientation of the magnetic strip 270, the Hall-effect sensor integrated circuit 282, and the magnetic flux pipe structures 286, 288 (without the PCB 242 shown). FIG. 8 is a first side cross-sectional view and FIG. 9 is a second opposite cross-section view taken through the center of the Hall-effect sensor integrated circuit 282 (e.g., through line shown in FIG. 6) to further illustrate the orientation of the magnetic strip 270, the Hall-effect sensor integrated circuit 282, and the magnetic flux pipe structures 286, 288. FIG. 10 is a partial rear perspective view of the control unit 220 without the PCB 242 shown, but with the location of the PCB 242 shown in dashed lines. FIG. 11 is an enlarged front perspective view of the Hall-effect sensor integrated circuit 282 and the magnetic flux pipe structures 286, 288 once again without the PCB 242 shown, but with the location of the PCB 242 shown in dashed lines.

The magnetic flux pipe structures 286, 288 may be configured to be mounted to the PCB 242 (e.g., soldered to electrical pads on the PCB 242, glued to the electrical pads on the PCB 242, shaped on the electrical pads of the PCB 242, etc.), for example, as shown in FIGS. 6, 8, and 9. The magnetic flux pipe structures 286, 288 may be configured to conduct and direct the magnetic fields generated by the magnetic ring 270 to direct the magnetic fields in a partially circular motion towards the Hall-effect sensor integrated circuit 282 (e.g., in the z-direction at the Hall-effect sensor integrated circuit 282).

The magnetic flux pipe structures 286, 288 may each comprise respective ring coupling portions 290, sensor coupling portions 292, and mounting portions 294. The ring coupling portions 290 and the sensor coupling portions 292 may be located at opposite ends of the respective magnetic flux pipe structures 286, 288. The sensor coupling portion 292 of each magnetic flux pipe structure 286, 288 may be arranged in a plane that is perpendicular to a plane of the respective ring coupling portion 290 (e.g., oriented at 90° from each other). The mounting portions 294 may be configured to be soldered to the electrical pads on the PCB 242. The ring coupling portions 290 of the magnetic flux pipe structures 286, 288 may be positioned adjacent to the magnetic strip 270 and may be located in a notch 296 in the PCB 242 when the mounting portions 294 are mounted to the PCB 242.

The ring coupling portions 290 may be configured to receive the magnetic fields generated by the positive and negative sections 272, 274 of the magnetic strip 270. The ring coupling portions 290 of the magnetic flux pipe structures 286, 288 may be oriented such that the ring coupling portion of the front magnetic flux pipe structure 286 is adjacent to a positive section 272 of the magnetic strip 270 when the ring coupling portion of the rear magnetic flux pipe structure 288 is adjacent to a negative section 274. For example, the positive section 272 to which the ring coupling portion 290 of the front magnetic flux pipe structure 286 is adjacent may be next to a negative section 274 to which the ring coupling portion 290 of the rear magnetic flux pipe structure 288 is adjacent, for example, as shown in FIG. 10. The ring coupling portion 290 of the front magnetic flux pipe structure 286 may also be adjacent to a negative section 272 of the magnetic strip 270 while the ring coupling portion 290 of the rear magnetic flux pipe structure 288 may be adjacent to a positive section 274. The ring coupling portions 290 of the magnetic flux pipe structures 286, 288 may be spaced apart by a distance that is approximately equal to an angular distance $\theta_{N-S}$ between the centers of adjacent positive and negative sections 272, 274 of the magnetic strip 270, for example, as shown in FIG. 7.

The sensor coupling portions 292 of the magnetic flux pipe structures 286, 288 may be oriented substantially over top of each other with the Hall-effect sensor integrated circuit 282 in between the sensor coupling portions 292 (e.g., as shown in FIGS. 7-9, 10, and 11). The Hall-effect sensor integrated circuit 282 may be mounted to the PCB 242 directly underneath the sensor coupling portion 292 of the rear magnetic flux pipe structures 288. The sensor coupling portions 292 may be configured to focus and direct the magnetic field generated by the magnetic strip 270 through the Hall-effect sensor integrated circuit 282 in the z-direction (e.g., the direction to which the Hall-effect sensor integrated circuit 282 is responsive to magnetic fields).

As shown in FIGS. 10 and 11, the magnetic flux pipe structures 286, 288 may have different shapes (e.g., from those described herein, and/or from one another). For example, the sensor coupling portion 292 of the front magnetic flux pipe structure 286 may be in the same plane as the respective mounting portion 294, while the sensor coupling portion 292 of the rear magnetic flux pipe structure 288 may be offset from the plane of the respective mounting portion 294 to accommodate the Hall-effect sensor integrated circuit 282. The magnetic flux pipe structures 286, 288 may have the same shape. For example, both magnetic flux pipe structures 286, 288 may have the shape of the rear magnetic flux pipe structure 288 shown in FIGS. 10 and 11. In one or more examples, the sensor coupling portion 292 may be oriented to match the natural shape of one or more magnetic field lines (e.g., magnetic field lines 299) as they travel between the north and south poles.

Figure 12:
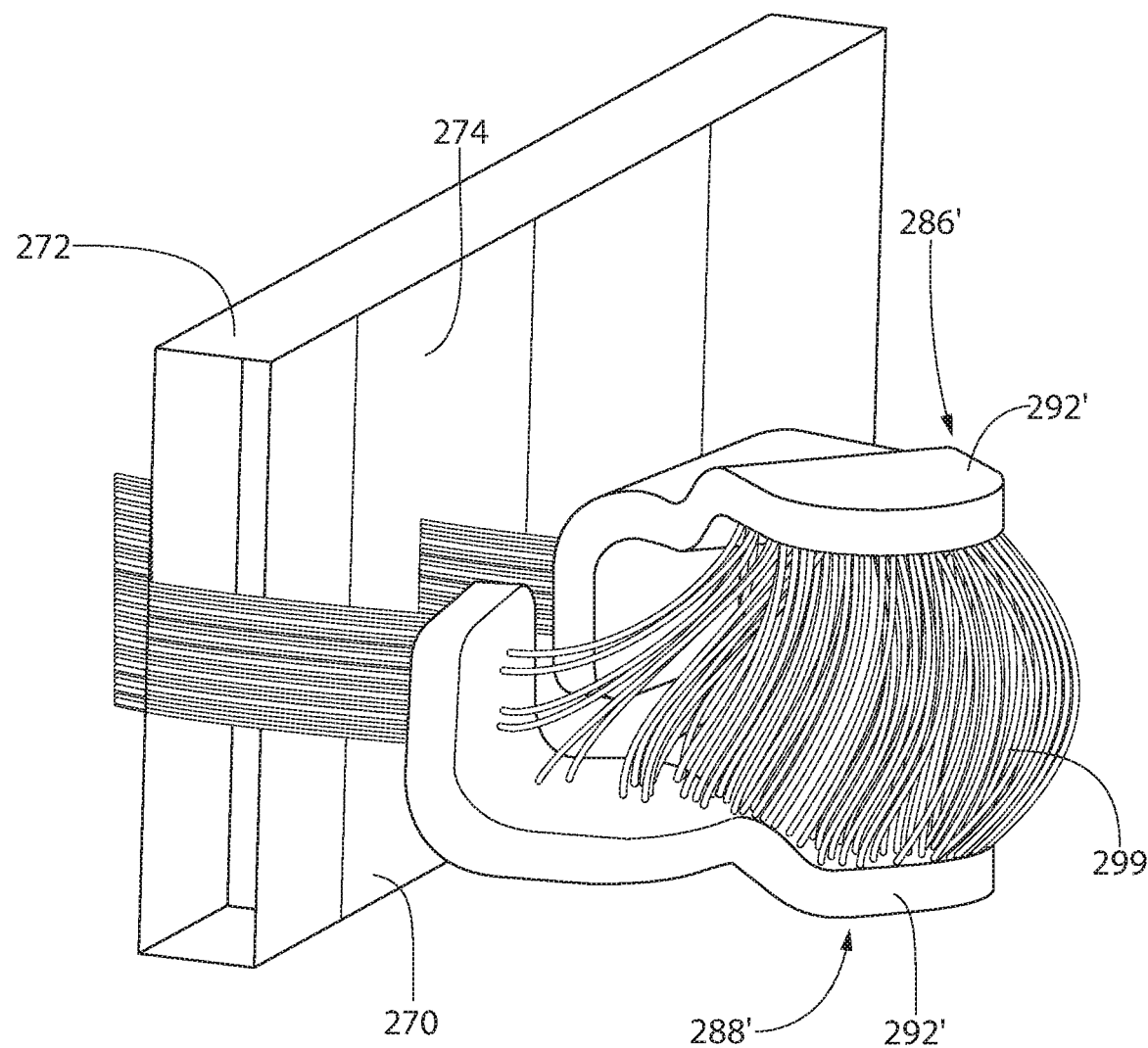
FIG. 12 is a perspective view of the perspective view of the components of Hall-effect sensor system illustrating magnetic field lines.

FIG. 12 is a perspective view of the magnetic ring 270 and magnetic flux pipe structures 286', 288' illustrating magnetic field lines 299. As shown in FIG. 12, the magnetic flux pipe structures 286', 288' have the same shape. The magnetic field lines 299 extend from the magnetic ring 270 through magnetic flux pipe structures 286', 288', where the magnetic field may have the greatest strength. Although not illustrated, the magnetic field lines may extend through the magnetic flux pipe structures 286', 288' toward the Hall-effect sensor integrated circuit 282 (not shown in FIG. 12). The magnetic field lines 299 may extend between sensor coupling portions 292' of the magnetic flux pipe structures 286', 288', which is where the Hall-effect sensor integrated circuit 282 may be located. The magnetic flux pipe structures 286', 288' may be oriented and sized to ensure that the strength of the magnetic field between the sensor coupling portions 292' is appropriate for the Hall-effect sensor integrated circuit 282 to detect the magnetic field.

The control unit 220 may comprise more than one (e.g., two) Hall-effect sensing circuit 280 (e.g., as described with reference to FIGS. 15 and 16). In such instances, each Hall-effect sensing circuit 280 may comprise a Hall-effect sensor integrated circuit 282 and two magnetic flux pipe structures 286, 288. For example, the control unit 220 may comprise two Hall-effect sensing circuits 280. The ring coupling portions 290 of the magnetic flux pipe structures 286, 288 of one of the Hall-effect sensing circuits 280 may be positioned adjacent each other at a first position along the circumference of the magnetic ring 270, and the ring coupling portions 290 of the other Hall-effect sensing circuit 280 may be positioned adjacent each other at a second position along the circumference of the magnetic ring 270.

The ring coupling portions 290 of the magnetic flux pipe structures 286, 288 of each of the Hall-effect sensing circuits 280 may be spaced apart by the distance $\theta_{N-S}$ (e.g., as shown in FIG. 7). When the ring coupling portions 290 of the magnetic flux pipe structures 286, 288 of one of the Hall-effect sensing circuits 280 are lined up with the centers of two adjacent positive and negative sections 272, 274 of the magnetic strip 270, the ring coupling portions 290 of the other Hall-effect sensing circuit 280 may be offset from the centers of two other adjacent positive and negative sections 272, 274 of the magnetic strip 270. For example, the ring coupling portions 290 of the other Hall-effect sensing circuit 280 may be offset by an offset distance $\theta_{OS}$ (e.g., one-half of the distance $\theta_{N-S}$) from the centers of the two other adjacent positive and negative sections 272, 274 of the magnetic strip 270. For example, the offset distance $\theta_{OS}$ may be such that when the ring coupling portions 290 of the magnetic flux pipe structures 286, 288 of one of the Hall-effect sensing circuits 280 are lined up with the centers of two adjacent positive and negative sections 272, 274 of the magnetic strip 270, the ring coupling portions 290 of the other Hall-effect sensing circuit 280 may be lined up with a transition between a positive section 272 and a negative section 274 of the magnetic strip 270.

Figure 13A:
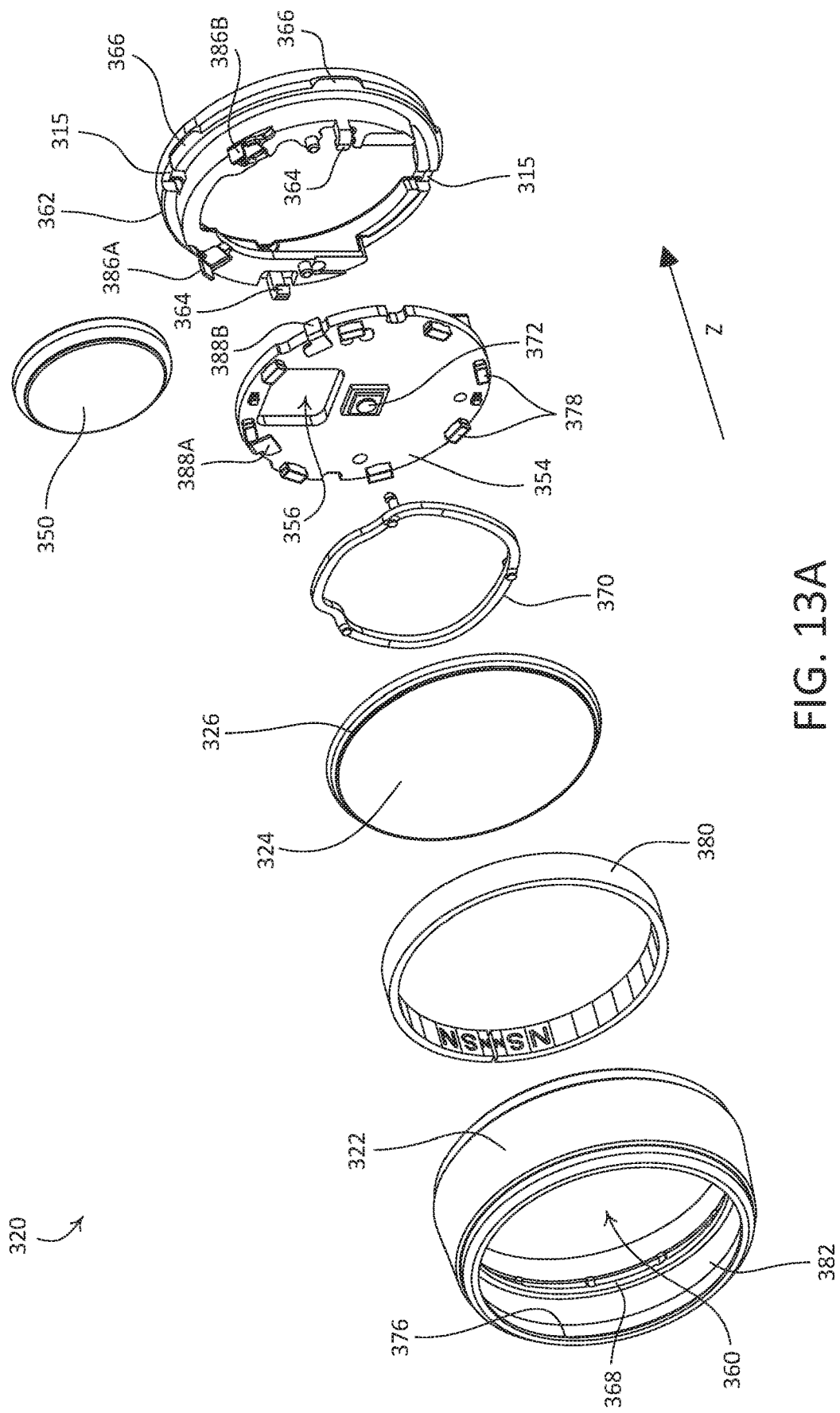
FIG. 13A is a front-facing exploded view of an example control unit of a remote control device.
Figure 13B:
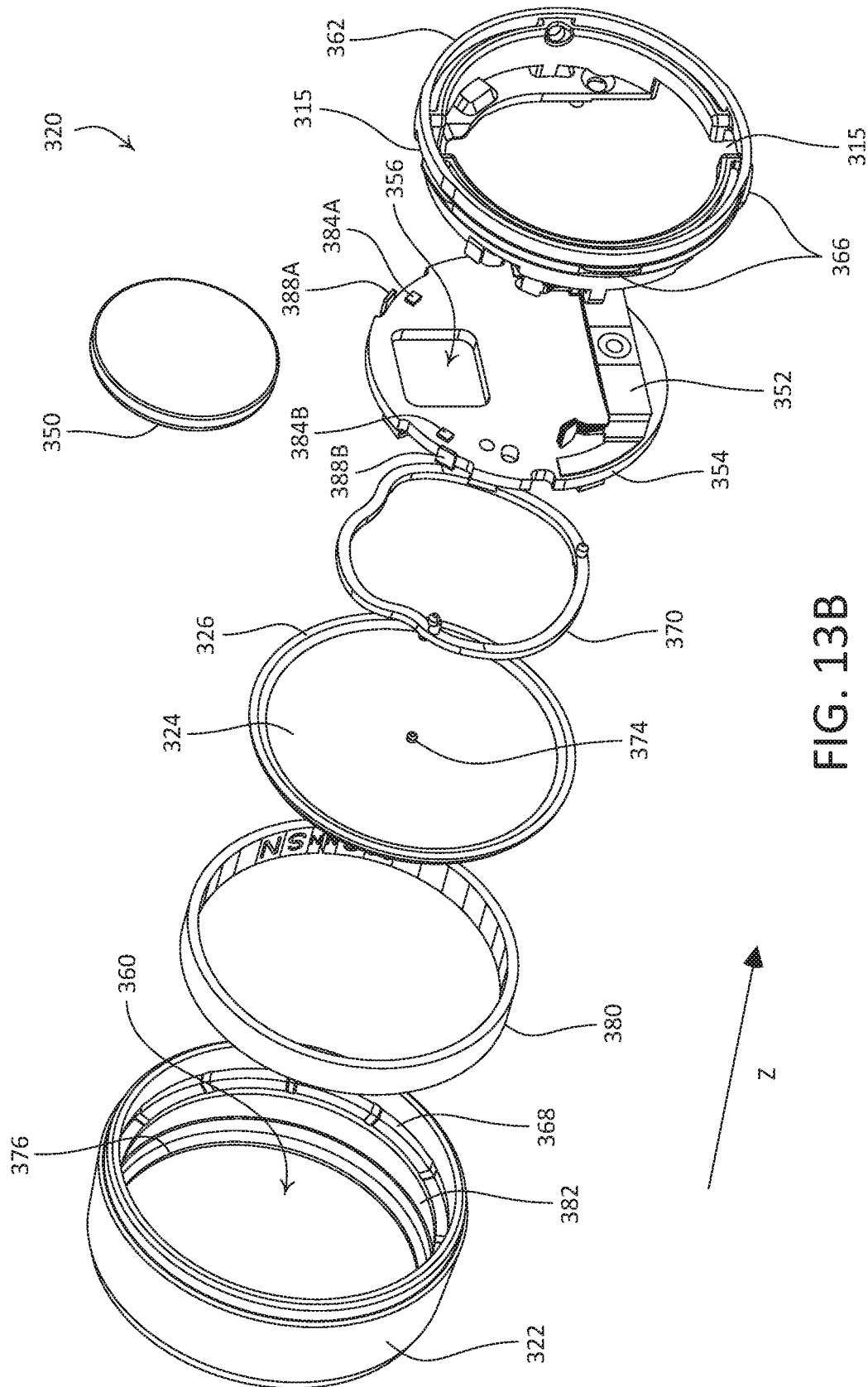
FIG. 13B is a rear-facing exploded view of an example control unit of a remote control device.

FIG. 13A is a front-facing exploded view and FIG. 13B is a rear-facing exploded view of an example control unit 320 of an example remote control device. The control unit 320 may be implemented as, for example, the control unit 220 of the remote control device 200 shown in FIG. 2. The control unit 320 may be detached from a mounting assembly (e.g., the mounting assembly 210), for instance to access one or more batteries 350 that may be used to power the control unit 320.

The control unit 320 may include a single battery 350 as shown in FIG. 13B. The control unit 320 may be configured such that the battery 350 is located in space within the control unit 320 that is not occupied by a toggle actuator. The control unit 320 may include a battery retention strap 352 that may be configured to hold the battery 350 in place between the battery retention strap 352 and a printed circuit board (PCB) 354 of the control unit 320. The battery retention strap 352 may be configured to operate as a first electrical contact for the battery 350. A second electrical contact may be located on a rear-facing surface of the PCB 354. In an example of removing the battery 350 from the control unit 320, the control unit 320 may be detached from the mounting assembly, and the battery 350 may be slid out from between the battery retention strap 352 and the PCB 354. The PCB 354 may define an actuator opening 356 that extends there through and that may be configured to receive at least a portion of the toggle actuator of the light switch when the control unit 320 is mounted to the mounting assembly. Alternatively, the control unit 320 may be integral with a dimmer switch, for example, as describe herein. In such instances, the control unit 320 may receive AC power and the battery may be omitted.

The control unit 320 may include a light bar 326. The light bar 326 may be located, for example, between the rotating portion 322 and the actuation portion 324. As shown, the light bar 326 may define a full circle geometry as shown in FIGS. 13A and 13B. As shown, the light bar 326 may be attached to a periphery of the actuation portion 324, and may move with the actuation portion 324 when the actuation portion 324 is actuated. Alternatively, the light bar 326 may be attached to a periphery of the rotating portion 322. The remote control device may provide feedback via the light bar 326, for instance while the rotating portion 322 is being rotated and/or after the remote control device is actuated (e.g., the rotating portion 322 is rotated and/or the actuation portion 324 is actuated). The feedback may indicate, for example, that the remote control device is transmitting one or more RF signals 108. To illustrate, the light bar 326 may be illuminated for a few seconds (e.g., 1-2 seconds) after the remote control device is actuated, and then may be turned off (e.g., to conserve battery life). The light bar 326 may be illuminated to different intensities, for example depending on whether the rotating portion 322 is being rotated to raise or lower the intensity of the lighting load. The light bar 326 may be illuminated to provide feedback of an actual intensity of a lighting load being controlled by the remote control device (e.g., the controllable light source 110).

The light bar 326 may be attached to the actuation portion 324 around a periphery of the actuation portion 324. The actuation portion 324 may be received within an opening 360 of the rotating portion 322 and may float freely in the opening 360. When the actuation portion 324 is received within the opening 360 of the rotating portion 322, the light bar 326 may be located between the actuation portion 324 and the rotating portion 322 such that the light bar 326 is visible to a user of the remote control device.

The PCB 354 may include a mechanical tactile switch 372 that may be mounted to a front-facing surface of the PCB 354. Control circuitry of the control unit 320 may be mounted to the PCB 354, for example to the one or both of the front-facing and rear-facing surfaces. As shown, the control unit 320 may include a plurality of light-emitting diodes (LEDs) 378 arranged around a perimeter of the PCB 354. The LEDs 378 may be configured to illuminate the light bar 326.

The control unit 320 may include an attachment portion 362 that is configured to carry one or more components of the control unit 320, such as the PCB 354. For example, as shown the PCB 354 may be attached to the attachment portion 362 via snap-fit connectors 364. The attachment portion 362 may include a plurality of tabs 366 arranged around a circumference of the attachment portion 362. The tabs 366 may be configured to be received within corresponding channels 368 defined by the rotating portion 322, to thereby couple the rotating portion 322 to the attachment portion 362 and allow for rotation of the rotating portion 322 around the attachment portion 362. As shown, the attachment portion 362 may define the recesses 315. When the control unit 320 is connected to the mounting assembly, the snap-fit connectors of the mounting assembly may be received in the recesses 315 of the attachment portion 362. The attachment portion 362 and the PCB 354 may remain fixed in position relative to the mounting assembly as the rotating portion 322 is rotated around the attachment portion 362. When the control unit 320 is attached to the mounting assembly, a portion of the toggle actuator of the light switch may be received in the actuator opening 356 of the PCB 354, such that the rotating portion 322 rotates about the toggle actuator 304 when operated.

The control unit 320 may include a resilient return spring 370 that may be located between the actuation portion 324 and the PCB 354. The return spring 370 may be configured to be attached to the PCB 354. The actuation portion 324 may define a projection 374 that extends rearward from an inner surface of the actuation portion 324. When a force is applied to the actuation portion 324 (e.g., when the actuation portion 324 is pressed by a user of the remote control device), the actuation portion 324, and thus the light bar 326, may move in the direction Z until the projection 374 actuates the mechanical tactile switch 372. The return spring 370 may compress under application of the force. When application of the force is ceased (e.g., the user no longer presses the actuation portion 324), the return spring 370 may decompress, thereby to biasing the actuation portion 324 forward such that the actuation portion 324 abuts a rim 376 of the rotating portion 322. In this regard, the return spring 370 may operate to return the actuation portion 324 from an activated (e.g., pressed) position to a rest position.

The control unit 320 may include a magnetic strip 380 (e.g., a magnetic ring, such as the magnetic ring 270) that may be disposed along an inner surface 382 of the rotating portion 322. The magnetic strip 380 may extend around an inner circumference of the rotating portion 322. The control unit 320 may include one or more magnetic sensing circuit, such as Hall-effect sensing circuits (e.g., the Hall-effect sensing circuits 280). Each Hall-effect sensing circuit may comprise a Hall-effect sensor integrated circuit 384A, 384B that may be mounted on the PCB 354 (e.g., to a rear side of the PCB as shown in FIG. 13B). The Hall-effect sensor integrated circuits 384A, 384B may comprise a plurality of mounting pads (not shown).

The magnetic strip 380 may be configured to generate a magnetic field in a first direction (e.g., perpendicular to the z-direction, along the x-y plane), while the Hall-effect sensor integrated circuits 384A, 384B may be responsive to magnetic fields in a second direction (e.g., the z-direction) that is angularly offset from the first direction (e.g., offset by 90 degrees). For example, the Hall-effect sensor integrated circuits 384A, 384B of each Hall-effect sensing circuit may be responsive to magnetic fields directed in the z-direction (e.g., perpendicular to the plane of the PCB 354). However, the magnetic strip 380 may generate magnetic fields in directions perpendicular to the z-direction, e.g., in the x-y plane. Accordingly, each Hall-effect sensing circuit may further comprise one or more magnetic flux pipe structures 386A, 388A, 386B, 388B for conducting and directing the magnetic fields generated by the magnetic strip 380 to direct the magnetic fields in the z-direction at the Hall-effect sensor integrated circuit 384A, 384B.

The magnetic strip 380 may include a plurality of alternating positive and negative sections, and the Hall-effect sensor integrated circuits 384A, 384B may be operable to detect passing of the positive and negative sections of the magnetic strip 380 as the rotating portion 322 is rotated about the attachment portion 362. The control circuit of the control unit 320 may be configured to determine a rotational speed and/or direction of rotation of the rotating portion 322 in response to the Hall-effect sensor integrated circuit 384A, 384B. Each Hall-effect sensor integrated circuit 384A, 384B may be located adjacent to one or more magnetic flux pipe structures 386A, 386B, 388A, 388B. Each magnetic flux pipe structure 386A, 386B, 388A, 388B may be configured to conduct and direct respective magnetic fields generated by the magnetic strip 380 toward corresponding Hall-effect sensor integrated circuit 384A, 384B. For example, the magnetic flux pipe structure 386A and 388A may be configured to conduct and direct respective magnetic fields generated by the magnetic strip 380 toward Hall-effect sensor integrated circuit 384A, while the magnetic flux pipe structure 386B and 388B may be configured to conduct and direct respective magnetic fields generated by the magnetic strip 380 toward Hall-effect sensor integrated circuit 384B.

As shown, the magnetic flux pipe structures 386A, 386B may be connected to the attachment portion 362, and the magnetic flux pipe structures 388A, 388B may be mounted to the PCB 354. However, any of the magnetic flux pipe structures 386A, 386B, 388A, 388B may be mounted to any other component of the control unit 320. For example, the magnetic flux pipe structures 386A, 386B may be mounted to (e.g., integral with) the battery retention strap 352. In such instances, the locations of the magnetic flux pipe structures 388A, 388B and the Hall-effect sensor integrated circuit 384A, 384B may moved accordingly.

The ring coupling portions of the magnetic flux pipe structures 386A, 386B, 388A, 388B of each of the Hall-effect sensing circuits may be spaced apart by the distance $\theta_{N-S}$ (e.g., similar to the spacing illustrated in FIG. 7 with respect to the Hall-effect sensing circuits 280). When the ring coupling portions of the magnetic flux pipe structures 386A, 386B, 388A, 388B of one of the Hall-effect sensing circuits are lined up with the centers of two adjacent positive and negative sections of the magnetic strip 380, the ring coupling portions of the magnetic flux pipe structures 386A, 386B, 388A, 388B of the other Hall-effect sensing circuit may be offset from the centers of two other adjacent positive and negative sections of the magnetic strip 380. For example, the ring coupling portions of the other Hall-effect sensing circuit may be offset by an offset distance $\theta_{OS}$ (e.g., one-half of the distance $\theta_{N-S}$) from the centers of the two other adjacent positive and negative sections of the magnetic strip 380. For example, the offset distance $\theta_{OS}$ may be such that when the ring coupling portions of the magnetic flux pipe structures 386A, 386B, 388A, 388B of one of the Hall-effect sensing circuits are lined up with the centers of two adjacent positive and negative sections of the magnetic strip 380, the ring coupling portions of the magnetic flux pipe structures 386A, 386B, 388A, 388B of the other Hall-effect sensing circuit may be lined up with a transition between a positive section and a negative section of the magnetic strip 380.

Although not illustrated, the Hall-effect sensing circuits of the control unit 320 may share a magnetic flux pipe structure (e.g., a single positive or negative pole). For example, the magnetic flux pipe structures 386A, 386B may be connected together for form a single magnetic flux pipe structure (not shown). In such instances, the magnetic flux pipe structures 386A, 386B may share a single ring coupling portion and may extend away from each other towards the respective Hall-effect sensor integrated circuits 384A, 384B. The Hall-effect sensing circuits may also comprise the respective magnetic flux pipe structures 388A, 388B positioned adjacent to the respective Hall-effect sensor integrated circuits 384A, 384B. As such, as the magnetic strip 380 is rotated, the magnetic field may be conducted from the shared ring coupling portion of the connected magnetic flux pipe structures 386A, 386B to the sensor coupling portion of the magnetic flux pipe structure 386A and be conducted from the sensor coupling portion of the magnetic flux pipe structure 388A to the ring coupling portion of the magnetic flux pipe structure 388A. At the same time, the magnetic field may also be conducted from the shared ring coupling portion of the connected magnetic flux pipe structures 386A, 386B to the sensor coupling portion of the magnetic flux pipe structure 386B and conducted from the sensor coupling portion of the magnetic flux pipe structure 388B to the ring coupling portion of the magnetic flux pipe structure 388B. Accordingly, the Hall-effect sensor integrated circuits 384A, 384B may both be responsive to the changing magnetic field through the use of a shared magnetic flux pipe structure (e.g., the connected magnetic flux pipe structures 386A, 386B).

Figure 14:
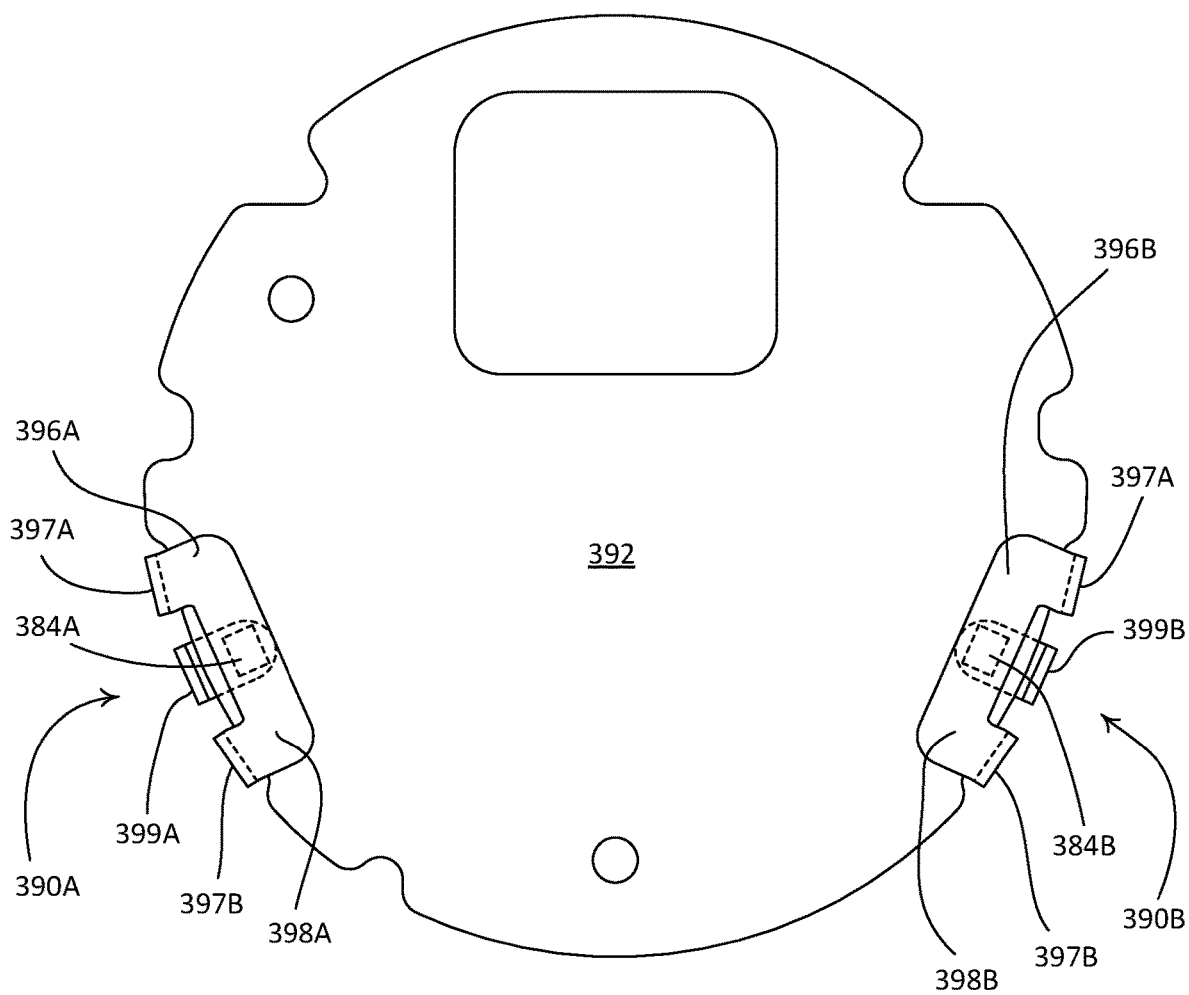
FIG. 14 is a partial front view of a control unit for a remote control device illustrating the structure of another example Hall-effect sensing circuits.

In addition, a control unit for a retrofit remote control device may comprise a single magnetic flux pipe structure having multiple (e.g., two) ring coupling portions. FIG. 14 is a partial front view of a control unit for a remote control device illustrating the structure of alternate example magnetic sensing circuits, such as Hall-effect sensing circuits 390A, 390B. Each Hall-effect sensing circuit 390A, 390B may comprise a respective Hall-effect sensor integrated circuit 384A, 384B mounted to a printed circuit board 392. Each Hall-effect sensing circuit 390A, 390B may further comprise a first magnetic flux pipe structure 396A, 396B and a second magnetic flux pipe structure 398A, 398B for conducting and directing the magnetic fields generated by a magnetic strip (e.g., such as the magnetic strip 380) to direct the magnetic fields in the z-direction at the respective Hall-effect sensor integrated circuit 384A, 384B. The second magnetic flux pipe structure 398A, 398B of each Hall-effect sensing circuit 390A, 390B may comprise a single ring coupling portion 399A, 399B. The first magnetic flux pipe structure 396A, 396B of each Hall-effect sensing circuit 390A, 390B may comprise two ring coupling portions 397A, 397B. The ring coupling portions 397A, 397B of each of the first magnetic flux pipe structures 396A, 396B are configured to be positioned adjacent sections of the magnetic ring of the same charge (e.g., both adjacent north-pole sections or south-pole sections) to increase the strength of the magnetic fields at the respective Hall-effect sensor circuit 390A, 390B.

Figure 15:
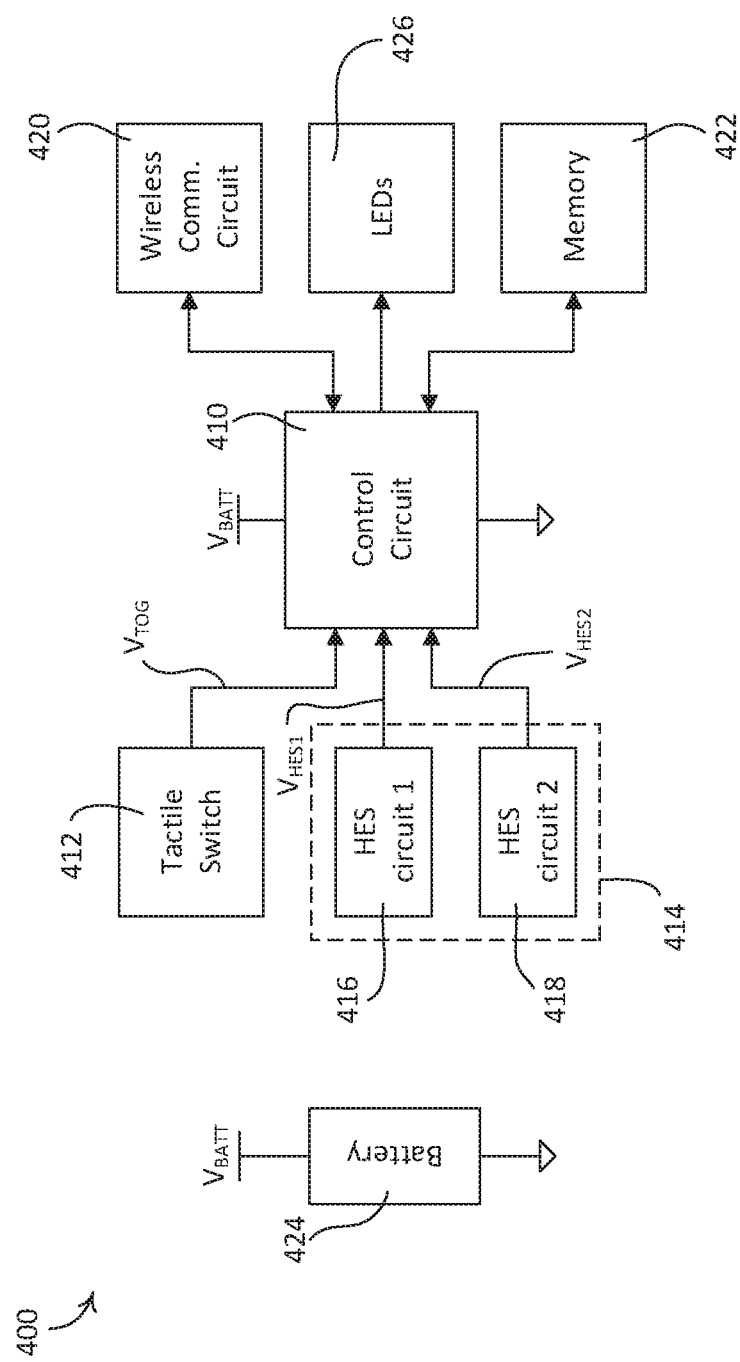
FIG. 15 is a simplified block diagram of an example control device that may be deployed as a remote control device (e.g., a rotary remote control device) of the load control system illustrated in FIG. 1.

FIG. 15 is a simplified block diagram of an example control device 400 (e.g., a remote control device) that may be implemented as, for example, the remote control device 120 shown in FIG. 1, the control unit 220 of the remote control device 200 shown in FIG. 2, and/or the control unit 320 of the remote control device shown in FIGS. 13A and 13B. As shown, the control device 400 includes a control circuit 410. The control circuit 410 may include one or more of a processor (e.g., a microprocessor), a microcontroller, a programmable logic device (PLD), a field programmable gate array (FPGA), an application specific integrated circuit (ASIC), or any suitable processing device.

The control device 400 may comprise a tactile switch 412 that may be actuated in response to actuations of an actuator (e.g., the actuation portion 224 of the control unit 220 and/or the actuation portion 324 of the control unit 320). The tactile switch 412 may generate a toggle control signal $V_{TOG}$ that may be representative of instances when the actuation portion 224, 324 of the control unit 220, 330 is pushed towards a mounting assembly (e.g., the mounting assembly 210), so as to toggle a controlled electrical load on and/or off.

The control device 400 may further comprise a magnetic sensing circuit 414. The magnetic sensing circuit 414 may be a rotational sensing circuit. The magnetic sensing circuit 141 may include a first Hall-effect sensing (HES) circuit 416 and a second Hall-effect sensing (HES) circuit 418. The first and second Hall-effect sensing circuits 416, 418 may represent the Hall-effect sensing circuits 280 described above (e.g., each comprising a Hall-effect sensor integrated circuit 282 and two magnetic flux pipe structures 286, 288, a Hall-effect sensor integrated circuit 384 and two magnetic flux pipe structures 386, 388, and/or the like). The Hall-effect sensing circuit 416, 418 may be configured to detect the magnetic fields generated by a circular magnetic element (e.g., the magnetic ring 270 and/or the magnetic strip 380) coupled to a rotary knob (e.g., the rotating portion 222 of the control unit 220 and/or the rotating portion 322 of the control unit 320). The first Hall-effect sensing circuit 416 may generate a first HES control signal $V_{HES1}$ and the second Hall-effect sensing circuit 418 may generate a second HES control signal $V_{HES2}$. The first and second HES control signals $V_{HES1}$, $V_{HES2}$ may, in combination, be representative of an angular velocity ω at which the rotating portion 222, 322 is rotated and an angular direction (e.g., clockwise or counter-clockwise) in which the rotating portion 222, 322 is rotated.

The control device 400 may also include a wireless communication circuit 420, for example an RF transmitter coupled to an antenna, for transmitting wireless signals, such as the RF signals 108, in response to rotations of the rotating portion 222, 322 and actuations of the actuation portion 224, 324. The control circuit 410 may cause the wireless communication circuit 420 to transmit one or more wireless signals to an associated load control device, for example the controllable light source 110 shown in FIG. 1. Alternatively or additionally, the wireless communication circuit 420 may include an RF receiver for receiving RF signals, an RF transceiver for transmitting and receiving RF signals, or an infrared (IR) receiver for receiving IR signals. The control circuit 410 may, responsive to receiving one or more of the toggle control signal $V_{TOG}$ and the first and second HES control signals $V_{HES1}$, $V_{HES2}$, cause the wireless communication circuit 420 to transmit one or more signals, for example RF signals 108, to a controllable light source associated with the rotary remote control device 400, for example the lighting load of the controllable light source 110 shown in FIG. 1.

The remote control device 400 may also include a memory 422 communicatively coupled to the control circuit 410. The control circuit 410 may be configured to use the memory 422 for the storage and/or retrieval of, for example, a unique identifier (e.g., a serial number) of the remote control device 400 that may be included in the transmitted RF signals. The memory 422 may be implemented as an external integrated circuit (IC) or as an internal circuit of the control circuit 410.

The remote control device 400 may also include a battery 424 for producing a battery voltage $V_{BATT}$ that may be used to power one or more of the control circuit 410, the rotational sensing circuit 414, the wireless communication circuit 420, the memory 422, and other low-voltage circuitry of the remote control device 400.

The remote control device 400 may include one or more visual indicators, for example, one or more LEDs 426, which are configured to provide feedback to a user of the remote control device 400. For example, the LEDs 426 may be configured to illuminate the light bar 226. The LEDs 426 may be operatively coupled to the control circuit 410. For example, the control circuit 410 may control the LEDs 426 to provide feedback indicating a status of the controllable light source 110, for example if the controllable light source 110 is on, off, or a present intensity of the controllable light source 110. The control circuit 410 may be configured to illuminate the LEDs 426 in order to provide an indication that the battery 424 is low on energy, to provide feedback during programming or association of the remote control device 400, and/or to provide a night light.

Figure 16A:
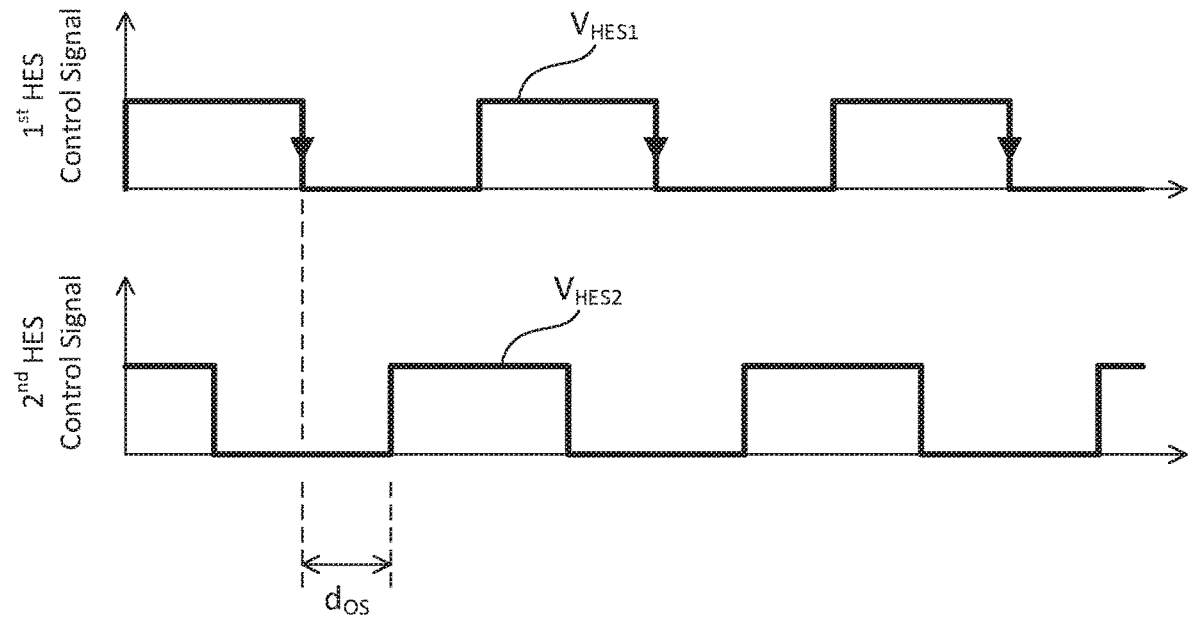
FIG. 16A depicts a first encoder control signal and a second encoder control signal when an example rotary remote control device is actuated along a first direction.
Figure 16B:
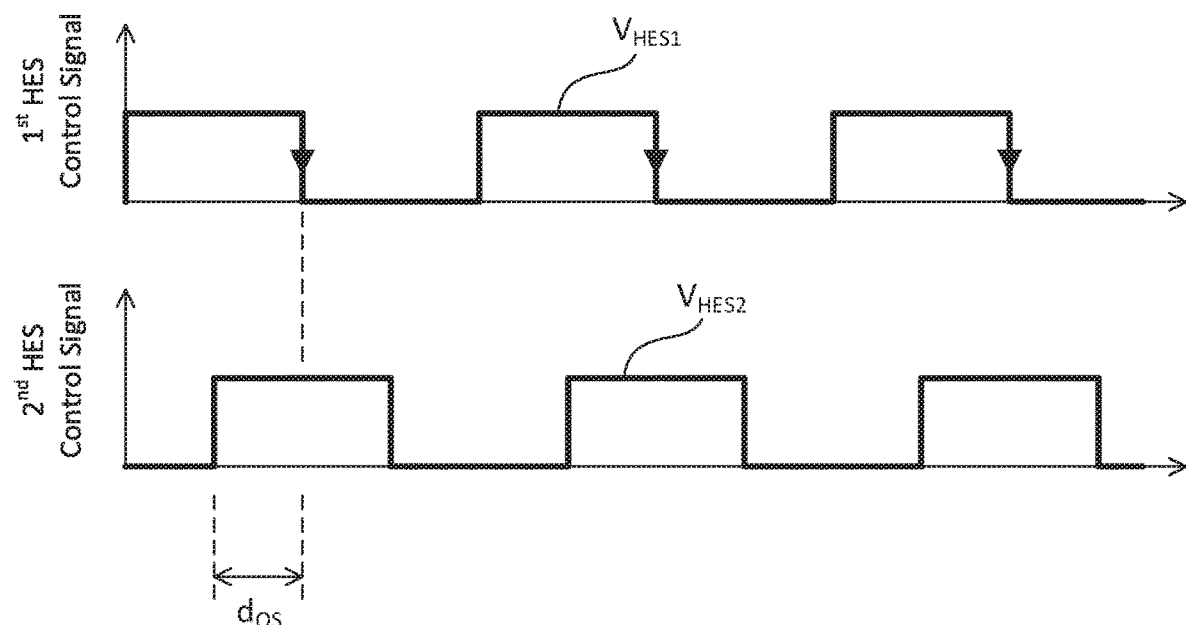
FIG. 16B depicts a first encoder control signal and a second encoder control signal when an example rotary remote control device is actuated along a second direction.

FIG. 16A is a simplified diagram showing example waveforms of the first HES control signal $V_{HES1}$ and the second HES control signal $V_{HES2}$ when the rotating portion 222, 322 is being rotated in the clockwise direction. The first HES control signal $V_{HES1}$ may lag the second HES control signal $V_{HES2}$ by an offset time $T_{OS}$ (e.g., one-half of the distance $\theta_{N-S}$) when the rotating portion 222, 322 is rotated clockwise. FIG. 16B is a simplified diagram showing example waveforms of the first HES control signal $V_{HES1}$ and the second HES control signal $V_{HES2}$ when the rotating portion 222, 322 is being rotated in the counter-clockwise direction. The second HES control signal $V_{HES2}$ may lag the first HES control signal $V_{HES1}$ by the offset time $T_{OS}$ when the rotating portion 222, 322 is rotated counter-clockwise. The offset time $T_{OS}$ may be a function of the offset distance $\theta_{OS}$ (e.g., one-half of the distance $\theta_{N-S}$) and an angular velocity ω of the rotating portion 222, 322 (e.g., $T_{OS}=74_{OS}/\omega$). The control circuit 410 may be configured to determine whether the second HES control signal $V_{HES2}$ is low (e.g., at approximately circuit common) or high (e.g., at approximately the battery voltage $V_{BATT}$) at the times of the falling edges of the first HES control signal $V_{HES1}$ (e.g., when the first HES control signal $V_{HES1}$ transitions from high to low), in order to determine whether the rotating portion 222, 322 is being rotated clockwise or counter-clockwise, respectively.

The lag between the first HES control signal $V_{HES1}$ and the second HES control signal $V_{HES2}$ may be based on the offset of the ring coupling portion of the Hall-effect sensing circuits 280 from the centers of the two other adjacent positive and negative sections of the magnetic strip. For example, the offset distance $\theta_{OS}$ (e.g., one-half of the distance $\theta_{N-S}$) may be such that when the ring coupling portions 290 of the magnetic flux pipe structures 286, 288 of one of the Hall-effect sensing circuits 280 are lined up with the centers of two adjacent positive and negative sections 272, 274 of the magnetic strip 270, the ring coupling portions 290 of the other Hall-effect sensing circuit 280 may be lined up with a transition between a positive section 272 and a negative section 274 of the magnetic strip 270. Similarly, and for example, the offset distance $\theta_{OS}$ (e.g., one-half of the distance $\theta_{N-S}$) may be such that when the ring coupling portions 397 of each of the first magnetic flux pipe structures 396, 398 of one of the Hall-effect sensing circuits are lined up with the centers of two adjacent positive and negative sections of the magnetic strip 380, the ring coupling portions 397 of the other Hall-effect sensing circuit may be lined up with a transition between a positive section and a negative section of the magnetic strip 380.

In FIGS. 16A and 16B, the down arrow may indicate a transition from a positive section 272 to a negative section 274 of the magnetic strip 270. Further, an entire period as shown in FIGS. 16A and 16B is from one pole to the same pole, for example, from a positive section 272 of the magnetic strip 270 to a subsequent positive section 272 of the magnetic strip 270. The distance $\theta_{N-S}$ from a positive pole to a negative pole may define a half period of a rotation of the rotating portion 222, 322, while the offset distance $\theta_{OS}$ may define one-fourth of the period (e.g., 90 degrees).

Figure 17:
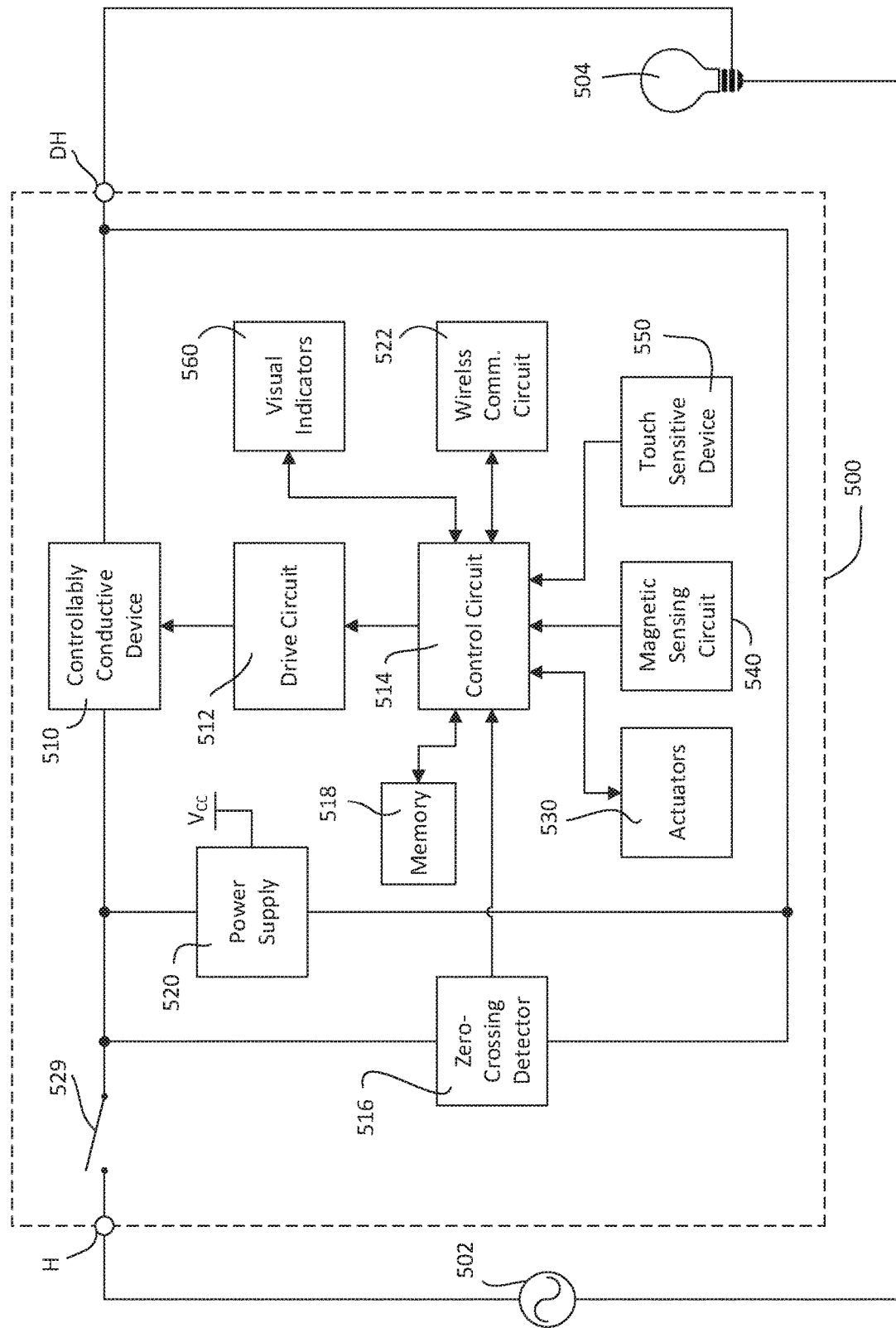
FIG. 17 shows a simplified block diagram of an example control device that may be deployed as a load control device (e.g., a dimmer switch) of the load control system illustrated in FIG. 1.

FIG. 17 is a simplified block diagram of an example control device 500 (e.g., a dimmer switch) that may be deployed as, for example, a load control device and/or a dimmer switch, such as those described herein. The control device 500 may include a hot terminal H that may be adapted to be coupled to an AC power source 502. The control device 500 may include a dimmed hot terminal DH that may be adapted to be coupled to an electrical load, such as a lighting load 504. The control device 500 may include a controllably conductive device 510 coupled in series electrical connection between the AC power source 502 and the lighting load 504. The controllably conductive device 510 may control the power delivered to the lighting load 504. The controllably conductive device 510 may include a suitable type of bidirectional semiconductor switch, such as, for example, a triac, a field-effect transistor (FET) in a rectifier bridge, two FETs in anti-series connection, or one or more insulated gate bipolar junction transistors (IGBTs). An air-gap switch 529 may be coupled in series with the controllably conductive device 510. The air-gap switch 529 may be opened and closed in response to actuations of an air-gap actuator (not shown). When the air-gap switch 529 is closed, the controllably conductive device 510 is operable to conduct current to the load. When the air-gap switch 529 is open, the lighting load 504 is disconnected from the AC power source 502.

The control device 500 may include a control circuit 514. The control circuit 514 may include one or more of a processor (e.g., a microprocessor), a microcontroller, a programmable logic device (PLD), a field programmable gate array (FPGA), an application specific integrated circuit (ASIC), or any suitable controller or processing device. The control circuit 514 may be operatively coupled to a control input of the controllably conductive device 510, for example, via a gate drive circuit 512. The control circuit 514 may be used for rendering the controllably conductive device 510 conductive or non-conductive, for example, to control the amount of power delivered to the lighting load 504.

The control circuit 514 may receive a control signal representative of the zero crossing points of the AC main line voltage of the AC power source 502 from a zero crossing detector 516. The control circuit 514 may be operable to render the controllably conductive device 510 conductive and/or non-conductive at predetermined times relative to the zero crossing points of the AC waveform using a phase-control dimming technique. Examples of dimmers are described in greater detail in commonly-assigned U.S. Pat. No. 7,242,150, issued Jul. 10, 2007, entitled "Dimmer Having a Power Supply Monitoring Circuit," U.S. Pat. No. 7,546,473, issued Jun. 9, 2009, entitled "Dimmer Having a Microprocessor-Controlled Power Supply," and U.S. Pat. No. 8,664,881, issued Mar. 4, 2014, entitled "Two-wire Dimmer Switch for Low-Power Loads," the entire disclosures of which are hereby incorporated by reference.

The control device 500 may include a memory 518. The memory 518 may be communicatively coupled to the control circuit 514 for the storage and/or retrieval of, for example, operational settings, such as, lighting presets and associated preset light intensities. The memory 518 may be implemented as an external integrated circuit (IC) or as an internal circuit of the control circuit 514. The control device 500 may include a power supply 520. The power supply 520 may generate a direct current (DC) supply voltage $V_{CC}$ for powering the control circuit 514 and the other low voltage circuitry of the control device 500. The power supply 520 may be coupled in parallel with the controllably conductive device 510. The power supply 520 may be operable to conduct a charging current through the lighting load 504 to generate the DC supply voltage $V_{CC}$.

The control circuit 514 may be responsive to inputs received from actuators 530, a magnetic sensing circuit 540 (e.g., which may include a magnetic rotational position sensing circuit), and/or a touch sensitive device 550. The control circuit 514 may control the controllably conductive device 510 to adjust the intensity of the lighting load 504 in response to the input received via the actuators 530, the magnetic sensing circuit 540, and/or the touch sensitive device 550.

The magnetic sensing circuit 540 may be configured to translate a force applied to a rotating mechanism (e.g., such as the rotating portion 222 of the control unit 210 and/or the rotating portion 322 of the control unit 320) into an input signal and provide the input signal to the control circuit 514. The magnetic sensing circuit 540 may include, for example, a rotational sensing circuit (e.g., the rotational sensing circuit 414), such as one or more Hall-effect sensors (e.g., such as the Hall-effect sensor circuit 280, the Hall-effect sensor circuit of FIGS. 13A and 13B4, etc.), a mechanical encoder, and/or an optical encoder. The magnetic sensing circuit 540 may also operate as an antenna of the control device 500. The actuators 530 may include a button or switch (e.g., a mechanical button or switch, or an imitation thereof). The actuators 530 may be configured to send respective input signals to the control circuit 514 in response to actuations of the actuators 530 (e.g., in response to movements of the actuators 530).

The touch sensitive device 550 may include a capacitive or resistive touch element. Examples of such a touch sensitive device may include the touch sensitive circuit 240 of remote control device 220, the touch sensitive surface of the control unit 320, and the touch sensitive surface of the control device 500. The touch sensitive device 550 may be configured to detect point actuations and/or gestures (e.g., the gestures may be effectuated with or without physical contacts with the touch sensitive device 550), and provide respective input signals to the control circuit 514 indicating the detection. The control circuit 514 may be configured to translate the input signals received from the actuators 530, the magnetic sensing circuit 540, and/or the touch sensitive device 550 into control data (e.g., one or more control signals), and cause the control data to be transmitted to the lighting load 504 or a central controller of the load control system.

It should be noted that, although depicted as including all of the magnetic circuit 540, the actuators 530, and the touch sensitive device 550, the control device 500 may include any combination of the foregoing components (e.g., one or more of those components).

The control device 500 may comprise a wireless communication circuit 522. The wireless communication circuit 522 may include for example, a radio-frequency (RF) transceiver coupled to an antenna for transmitting and/or receiving RF signals. The wireless communication circuit 522 may also include an RF transmitter for transmitting RF signals, an RF receiver for receiving RF signals, or an infrared (IR) transmitter and/or receiver for transmitting and/or receiving IR signals. The wireless communication circuit 522 may be configured to transmit a control signal that includes the control data (e.g., a digital message) generated by the control circuit 514 to the lighting load 504. As described herein, the control data may be generated in response to a user input to adjust one or more operational aspects of the lighting load 504. The control data may include a command and/or identification information (e.g., such as a unique identifier) associated with the control device 500. In addition to or in lieu of transmitting the control signal to the lighting load 504, the wireless communication circuit 522 may be controlled to transmit the control signal to a central controller of the lighting control system.

The control circuit 514 may be configured to illuminate visual indicators 560 (e.g., LEDs) to provide feedback of a status of the lighting load 504, to indicate a status of the control device 500, and/or to assist with a control operation (e.g., to provide a color gradient for controlling the color of the lighting load 504, to present backlit virtual buttons for preset, zone, or operational mode selection, etc.). The visual indicators 560 may be configured to illuminate a light bar and/or to serve as indicators of various conditions.

While the magnetic sensing circuits are shown and described herein as the Hall-effect sensing circuits, the magnetic sensing circuits could be implemented as any type of magnetic sensing circuit, such as, for example, a tunneling magnetoresistance (TMR) sensor, an anisotropic magnetoresistance (AMR) sensor, a giant magnetoresistance (GMR) sensor, a reed switch, or other mechanical magnetic sensor. The output signals of the magnetic sensing circuits may be analog or digital signals.

Although described with reference to a circular magnetic element, such as the magnetic rings 270 and 380, that includes alternating positive and negative sections configured to generate a magnetic field in a first direction, it should be appreciated that any of the control devices described herein may include a magnetic element of a different shape and/or size. And similarly, although described with reference to a rotating portion, such as the rotating portion 222, the control device may include a movable portion that is of a different shape and/or size. For example, the control device may include a linear slider and a linear magnetic element that enables the control device to be responsive to movements of the linear slider.

The invention claimed is:

1. A control device comprising:
    a moving portion;
    a magnetic element coupled to the moving portion, the magnetic element comprising alternating positive and negative sections configured to generate a magnetic field in a first direction;
    a first magnetic sensing circuit and a second magnetic sensing circuit that are responsive to magnetic fields in a second direction that is angularly offset from the first direction; and
    a first magnetic flux pipe structure and a second magnetic flux pipe structure that are configured to conduct the magnetic field generated by the magnetic element and redirect the magnetic field towards the first magnetic sensing circuit and the second magnetic sensing circuit in the second direction, wherein each of the first magnetic flux pipe structure and the second magnetic flux pipe structure comprise a magnetic element coupling portion, a sensor coupling portion, and a mounting portion, and wherein the magnetic element coupling portion and the sensor coupling portion are located at opposite ends of a respective magnetic flux pipe structure.

2. The control device of claim 1, wherein the sensor coupling portion is arranged in a plane that is perpendicular to a plane of the respective magnetic element coupling portion.

3. The control device of claim 1, wherein the mounting portion is configured to be attached to a printed circuit board (PCB) of the control device, and wherein the magnetic element coupling portion is positioned adjacent to the magnetic element and located in a notch in the PCB when the mounting portion is attached to the PCB.

4. The control device of claim 1, wherein the second direction is angularly offset from the first direction by 90 degrees.

5. The control device of claim 1, wherein the first magnetic sensing circuit and the second magnetic sensing circuit each comprise a Hall-effect sensing circuit.

6. The control device of claim 1, wherein the magnetic element comprises a circular magnetic element, and wherein the moving portion comprises a rotating portion.

7. The control device of claim 1, wherein the magnetic element comprises a linear magnetic element, and wherein the moving portion comprises a linear slider.

8. The control device of claim 1, wherein the first magnetic flux pipe structure extends from a first location adjacent the magnetic element to a second location adjacent a first side of the first magnetic sensing circuit, and wherein the second magnetic flux pipe structure extends from a third location adjacent the magnetic element to a fourth location adjacent a second side of the second magnetic sensing circuit, and wherein the first and second magnetic flux pipe structures are configured to:
    conduct the magnetic field generated by the magnetic element towards the first magnetic sensing circuit and the second magnetic sensing circuit; and
    redirect the magnetic field towards the first magnetic sensing circuit and the second magnetic sensing circuit in the second direction.

9. The control device of claim 1, wherein the first magnetic flux pipe structure and a third magnetic flux pipe structure are configured to conduct the magnetic field to and from the first magnetic sensing circuit, and wherein the second magnetic flux pipe structure and the third magnetic flux pipe structure are configured to conduct the magnetic field to and from the second magnetic sensing circuit.

10. The control device of claim 9, wherein the first and second magnetic flux pipe structures are angularly offset such that the first and second magnetic flux pipe structures are both directed toward the third magnetic flux pipe structure; and
    wherein, when the magnetic element is moved, the first and third magnetic flux pipe structures redirect the magnetic field toward the first magnetic sensing circuit and the second and third magnetic flux pipe structures redirect the magnetic field toward the second magnetic sensing circuit.

11. The control device of claim 1, wherein the magnetic element coupling portions of the first and second magnetic sensing circuits are offset from the centers of two adjacent positive and negative sections of the magnetic element.

12. The control device of claim 1, wherein, when magnetic element coupling portions of the first magnetic flux pipe structure are lined up with the centers of two adjacent positive and negative sections of the magnetic element, magnetic element coupling portions of the second magnetic flux pipe structure are each lined up with a transition between a positive section and a negative section of the magnetic element.

13. The control device of claim 1, further comprising:
a base portion configured to be fixedly attached to an actuator of a mechanical switch; and
a control unit comprising the moving portion, the magnetic element, the first and second magnetic sensing circuits, and the first and second magnetic flux pipe structures;
wherein the control unit is configured to be removably attached to the base portion.

14. The control device of claim 13, wherein the base portion is configured to maintain the actuator in an on position; and
wherein the control unit further comprises a wireless communication circuit configured to transmit one or more wireless communication signals to one or more control devices.

15. The control device of claim 1, further comprising:
a yoke configured to mount the control device to a standard electrical wallbox, wherein the control device is configured to be coupled in series electrical connection between an alternating current (AC) power source and a controllable electrical load.

16. A magnetic sensing system comprising:
a first magnetic sensing circuit and a second magnetic sensing circuit that are responsive to a magnetic field generated by a magnetic element, the magnetic element comprising alternating positive and negative sections configured to generate the magnetic field in a first direction, wherein the first and second magnetic sensing circuits are responsive to the magnetic field in a second direction that is angularly offset from the first direction; and
at least two magnetic flux pipe structures configured to conduct the magnetic field generated by the magnetic element and redirect the magnetic field generated by the magnetic element towards the first and second magnetic sensing circuits in the second direction, wherein each of the at least two magnetic flux pipe structures comprise a magnetic element coupling portion, a sensor coupling portion, and a mounting portion, and wherein the magnetic element coupling portion and the sensor coupling portion are located at opposite ends of a respective magnetic flux pipe structure.

17. The magnetic sensing system of claim 16, wherein the second direction is angularly offset from the first direction by 90 degrees.

18. The magnetic sensing system of claim 16, wherein the magnetic element comprises a circular magnetic sensing circuit.

19. The magnetic sensing system of claim 17, wherein a first magnetic flux pipe structure of the at least two magnetic flux pipe structures extends from a first location adjacent the magnetic element to a second location adjacent a first side of the first magnetic sensing circuit, and wherein a second magnetic flux pipe structure of the at least two magnetic flux pipe structures extends from a third location adjacent the magnetic element to a fourth location adjacent a second side of the second magnetic sensing circuit, and wherein the first and second magnetic flux pipe structures are configured to conduct the magnetic field generated by the magnetic element towards the first and second magnetic sensing circuits and redirect the magnetic field towards the first and second magnetic sensing circuits in the second direction.

20. The magnetic sensing system of claim 17, wherein the sensor coupling portion is arranged in a plane that is perpendicular to a plane of the respective magnetic element coupling portion.

21. The magnetic sensing system of claim 17, wherein, when magnetic element coupling portions of one of the at least two magnetic flux pipe structures are lined up with the centers of two adjacent positive and negative sections of the magnetic element, magnetic element coupling portions of another of the at least two magnetic flux pipe structures are each lined up with a transition between a positive section and a negative section of the magnetic element.

\* \* \* \* \*